(12) United States Patent
Yamazaki

(10) Patent No.: US 8,368,075 B2
(45) Date of Patent: Feb. 5, 2013

(54) PLASMA CVD APPARATUS

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/946,224

(22) Filed: Nov. 15, 2010

(65) Prior Publication Data
US 2011/0056435 A1 Mar. 10, 2011

Related U.S. Application Data

(62) Division of application No. 12/222,082, filed on Aug. 1, 2008, now Pat. No. 7,842,586.

(30) Foreign Application Priority Data

Aug. 17, 2007 (JP) ................. 2007-212848
Aug. 17, 2007 (JP) ................. 2007-212946

(51) Int. Cl.
*H01L 29/04* (2006.01)
*H01L 31/20* (2006.01)
*H01L 31/036* (2006.01)
*H01L 31/0376* (2006.01)

(52) U.S. Cl. ............ 257/59; 257/71; 257/72; 438/479; 438/482

(58) Field of Classification Search .................. 257/59, 257/71, 72; 438/479, 482, 483, 488, 513
See application file for complete search history.

(56) References Cited

U.S. PATENT DOCUMENTS

| | | | |
|---|---|---|---|
| 4,409,134 A | 10/1983 | Yamazaki | |
| 4,971,667 A | 11/1990 | Yamazaki et al. | |
| 5,159,184 A | 10/1992 | Egawa et al. | |
| 5,256,509 A | 10/1993 | Hayashi et al. | |
| 5,453,858 A | 9/1995 | Yamazaki | |
| 5,571,571 A | 11/1996 | Musaka et al. | |
| 5,571,578 A | 11/1996 | Kaji et al. | |
| 5,591,987 A | 1/1997 | Yamazaki et al. | |
| 5,626,922 A | 5/1997 | Miyanaga et al. | |

(Continued)

FOREIGN PATENT DOCUMENTS

| | | |
|---|---|---|
| CN | 1520604 | 8/2004 |
| EP | 0 473 988 | 3/1992 |

(Continued)

OTHER PUBLICATIONS

Chinese Office Action (Application No. 200810210497.4) Dated Apr. 28, 2011.

(Continued)

*Primary Examiner* — Phuc Dang
(74) *Attorney, Agent, or Firm* — Eric J. Robinson; Robinson Intellectual Property Law Office, P.C.

(57) ABSTRACT

As an electrode area of a plasma CVD apparatus is enlarged, influence of the surface standing wave remarkably appears, and there is a problem in that in-plane uniformity of quality and a thickness of a thin film formed over a glass substrate is degraded. Two or more high-frequency electric powers with different frequencies are supplied to an electrode for producing glow discharge plasma in a reaction chamber. With glow discharge plasma produced by supplying the high-frequency electric powers with different frequencies, a semiconductor thin film or an insulating thin film is formed. High-frequency electric powers with different frequencies (different wavelengths), which are superimposed on each other, are applied to an electrode in a plasma CVD apparatus, so that increase in plasma density and uniformity for preventing effect of surface standing wave of plasma are attained.

8 Claims, 30 Drawing Sheets

U.S. PATENT DOCUMENTS

| | | | |
|---|---|---|---|
| 5,648,662 A | 7/1997 | Zhang et al. | |
| 5,676,765 A * | 10/1997 | Saito et al. | 136/258 |
| 5,688,330 A * | 11/1997 | Ohmi | 118/723 E |
| 5,701,167 A | 12/1997 | Yamazaki | |
| 5,766,989 A | 6/1998 | Maegawa et al. | |
| 5,779,807 A * | 7/1998 | Dornfest et al. | 134/1.2 |
| 5,811,328 A | 9/1998 | Zhang et al. | |
| 5,825,050 A | 10/1998 | Hirakawa | |
| 5,849,601 A | 12/1998 | Yamazaki | |
| 6,023,075 A | 2/2000 | Yamazaki | |
| 6,100,466 A | 8/2000 | Nishimoto | |
| 6,124,155 A | 9/2000 | Zhang et al. | |
| 6,166,399 A | 12/2000 | Zhang et al. | |
| 6,224,950 B1 | 5/2001 | Hirata | |
| 6,252,249 B1 | 6/2001 | Yamazaki | |
| 6,306,213 B1 | 10/2001 | Yamazaki | |
| 6,335,213 B1 | 1/2002 | Zhang et al. | |
| 6,756,258 B2 | 6/2004 | Zhang et al. | |
| 6,767,829 B2 | 7/2004 | Akahori | |
| 6,797,548 B2 | 9/2004 | Zhang et al. | |
| 6,847,064 B2 | 1/2005 | Zhang et al. | |
| 6,849,123 B2 | 2/2005 | Niino et al. | |
| 6,912,035 B2 * | 6/2005 | Kaneko et al. | 349/147 |
| 7,051,671 B2 * | 5/2006 | Aoki et al. | 118/723 E |
| 7,067,844 B2 | 6/2006 | Yamazaki | |
| 7,098,479 B1 | 8/2006 | Yamazaki | |
| 7,115,448 B2 | 10/2006 | Tsujimura et al. | |
| 7,115,902 B1 | 10/2006 | Yamazaki | |
| 7,125,588 B2 | 10/2006 | Miyanaga et al. | |
| 7,138,034 B2 | 11/2006 | Arita et al. | |
| 7,148,542 B2 | 12/2006 | Yamazaki | |
| 7,507,991 B2 | 3/2009 | Zhang et al. | |
| 7,576,360 B2 | 8/2009 | Yamazaki | |
| 8,088,331 B2 * | 1/2012 | Ueda et al. | 422/68.1 |
| 8,101,444 B2 * | 1/2012 | Yamazaki et al. | 438/30 |
| 2003/0143821 A1 * | 7/2003 | Niino et al. | 438/484 |
| 2004/0045505 A1 | 3/2004 | Higashikawa et al. | |
| 2004/0188685 A1 | 9/2004 | Lin et al. | |
| 2004/0238490 A1 * | 12/2004 | Sumiya et al. | 216/67 |
| 2005/0118794 A1 * | 6/2005 | Babayan et al. | 438/584 |
| 2008/0044962 A1 | 2/2008 | Zhang et al. | |
| 2008/0308807 A1 | 12/2008 | Yamazaki et al. | |
| 2009/0047760 A1 | 2/2009 | Yamazaki et al. | |

FOREIGN PATENT DOCUMENTS

| | | |
|---|---|---|
| EP | 0919643 A | 6/1999 |
| JP | 60-098680 | 6/1985 |
| JP | 61-087371 | 5/1986 |
| JP | 61-087371 A | 5/1986 |
| JP | 04-242724 | 8/1992 |
| JP | 06-077483 | 3/1994 |
| JP | 06-077483 A | 3/1994 |
| JP | 06-326026 | 11/1994 |
| JP | 07-211708 | 8/1995 |
| JP | 07-254592 | 10/1995 |
| JP | 11-121761 | 4/1999 |
| JP | 11-162857 A | 6/1999 |
| JP | 2000-150888 | 5/2000 |
| JP | 2001-007024 | 1/2001 |
| JP | 2001-127296 | 5/2001 |
| JP | 2001-127296 A | 5/2001 |
| JP | 3201492 | 8/2001 |
| JP | 2001-267310 A | 9/2001 |
| JP | 2001-326217 A | 11/2001 |
| JP | 2002-043225 A | 2/2002 |
| JP | 2002-246368 A | 8/2002 |
| JP | 2002-246605 | 8/2002 |
| JP | 2002-246605 A | 8/2002 |
| JP | 2002-327276 A | 11/2002 |
| JP | 2003-041369 A | 2/2003 |
| JP | 2005-049832 | 2/2005 |
| JP | 2005-049832 A | 2/2005 |
| JP | 2005-167051 | 6/2005 |
| JP | 2005-167051 A | 6/2005 |
| JP | 2007-005508 | 1/2007 |
| JP | 2007-005508 A | 1/2007 |
| JP | 2007-035964 | 2/2007 |
| JP | 2007-035964 A | 2/2007 |
| JP | 2007-049171 | 2/2007 |
| WO | WO-01/69642 | 9/2001 |
| WO | WO-03/001557 | 1/2003 |

OTHER PUBLICATIONS

Arai et al., "Micro Silicon Technology for Active Matrix OLED Display," SID 07 Digest, vol. 38, 2007, pp. 1370-1373.

Lee et al., "High-Mobility Nanocrystalline Silicon Thin-Film Transistors Fabricated by Plasma-Enhanced Chemical Vapor Deposition," Appl. Phys. Lett. (Applied Physics Letters), vol. 86, pp. 222106-1-222106-3, May 24, 2005.

Lee et al., "High-Mobility N-channel and P-channel Nanocrystalline Silicon Thin-Film Transistors," IEDM 05: Technical Digest of International Electron Devices Meeting pp. 937-940, 2005.

Lee et al., "Directly Deposited Nanocrystalline Silicon Thin-Film Transistors with Ultra High Mobilities," Appl. Phys. Lett. (Applied Physics Letters) vol. 89, No. 25, pp. 252101-1-252101-3, Dec. 18, 2006.

Lee et al., "How to Achieve High Mobility Thin Film Transistors by Direct Deposition of Silicon using 13.56 MHz RF PECVD?" IEDM 06: Technical Digest of International Electron Devices Meeting, pp. 295-298, 2006.

Esmaeili-Rad et al., "High Stability, Low Leakage Nanocrystalline Silicon Bottom Gate Thin Film Transistors for AMOLED Displays," IEDM 06: Technical Digest of International Electron Devices Meeting, pp. 303-306, 2006.

Lee et al., "Leakage Current Mechanisms in Top-Gate Nanocrystalline Silicon Thin-Film Transistors," Appl. Phys. Lett. (Applied Physics Letters), vol. 92, pp. 083509-1-083509-3, Feb. 28, 2008.

Esmaeili Rad et al., "Absence of Defect State Creation in Nanocrystalline Silicon Thin-Film Transistors Deduced from Constant Current Stress Measurements," Appl. Phys. Letters), vol. 91, No. 11, pp. 113511-1-113511-3, Sep. 12, 2007.

Lee et al., "Stability of Nc-Si:H TFTs with Silicon Nitride Gate Dielectric," IEEE Transactions on Electron Devices, vol. 54, No. 1, pp. 45-51, Jan. 2007.

Sazonov et al., "Low-Temperature Materials and Thin Film Transistors for Flexible Electronics," Proceedings of the IEEE, vol. 93, No. 8, pp. 1420-1428, Aug. 1, 2005.

Esmaeili-Rad et al., "Stability of Nanocrystalline Silicon Bottom-Gate Thin-Film Transistors with Silicon Nitride Gate Dielectric" J. Appl. Phys. (Journal of Applied Physics), vol. 102, No. 6, pp. 064512-1-064512-7, Sep. 28, 2007.

Lee et al., "Top-Gate TFTs Using 13.56 MHz PECVD Microcrystalline Silicon," IEEE Electron Device Letters, vol. 26, No. 9, pp. 637-639, Sep. 5, 2005.

Lee et al., "Postdeposition Thermal Annealing and Material Stability of 75° C. Hydrogenated Nanocrystalline Silicon Plasma-Enhanced Chemical Vapor Deposition Films," J. Appl. Phys. (Journal of Applied Physics), vol. 98, No. 3, pp. 034305-1-034305-7, Aug. 4, 2005.

* cited by examiner

PLASMA CVD APPARATUS

BACKGROUND OF THE INVENTION

1. Field of the Invention

The present invention relates to a technique for forming a thin film and a technique for manufacturing an element utilizing plasma.

2. Description of the Related Art

The market of liquid crystal displays using thin film transistors (hereinafter, also referred to as "TFT") has been expanded. TFTs are one kind of field effect transistors and include a thin film of a semiconductor layer for forming a channel formation region. The semiconductor layer is formed of amorphous silicon or polycrystalline silicon.

Amorphous silicon TFTs have a problem that time for writing to a pixel is insufficient with increase in a panel size and density of the pixel. It has been considered that polycrystalline silicon TFTs solve the above-mentioned problem because the polycrystalline silicon TFTs have higher electron field-effect mobility than the amorphous silicon TFTs (for example, refer to Patent Document 1: Japanese Published Patent Application No. 2000-150888).

In addition to the above two kinds of semiconductor layers, TFTs in which a channel formation region is formed using a microcrystalline silicon semiconductor are known (for example, Patent Document 2: U.S. Pat. No. 5,591,987 and Non-Patent Reference 1: Toshiaki Arai, et al., SID 07 DIGEST, 2007, pp. 1370-1373). Microcrystalline silicon is formed by a plasma CVD (Chemical Vapor Deposition) method, similarly to amorphous silicon. For example, as a method for manufacturing a microcrystalline silicon layer by a plasma CVD method, there is a method in which a high frequency in the VHF (very high frequency) band of 30 MHz or higher is utilized (refer to Patent Document 3: Japanese Patent No. 3201492).

Incidentally, a liquid crystal display is manufactured by processing a plurality of panels over a large-sized glass substrate called mother glass and cutting the substrate into the panels having sizes corresponding to screens of television sets or personal computers lastly. This is because cost per one panel is reduced by taking out a plurality of panels from one mother glass. In the market of liquid crystal displays, screen sizes (panel sizes) have been increased rapidly, and selling prices have been reduced rapidly. In order to improve productivity along with increase in sizes and reduction in cost, increase in the size of mother glass has been promoted.

The size of the typical glass substrate in around 1991, so-called first generation, was 300 mm×400 mm. After that, the mother glass has been enlarged to have sizes of 400 mm×500 mm (second generation), 550 mm×650 mm (third generation), 730 mm×920 mm (fourth generation), 1000 mm×1200 mm (fifth generation), 2450 mm×1850 mm (sixth generation), 1870 mm×2200 mm (seventh generation), 2000 mm×2400 mm (eighth generation), 2450 mm×3050 mm (ninth generation), and 2850 mm×3050 mm (tenth generation).

SUMMARY OF THE INVENTION

However, polycrystalline silicon needs to be subjected to excimer laser annealing, and a production line for manufacturing an amorphous silicon TFT needs to be drastically changed. Thus, newly capital investment is necessary, and the polycrystalline silicon panels cannot compete against amorphous silicon TFT panels in the production cost. On the other hand, the amorphous silicon TFTs have difficulty in solving such a problem that time for writing to a pixel is insufficient due to increase in the panel sizes and density of pixels.

At this point, according to the above, application of microcrystalline silicon TFTs is considered. As mother glass, in other words, a glass substrate over which a microcrystalline silicon layer is deposited, is enlarged, an electrode area of a plasma CVD apparatus becomes increased. In a case of the glass substrate of a size which exceeds the sixth generation, the electrode of the plasma CVD apparatus comes to have a size close to a wavelength of a frequency from a high-frequency power source. For example, a wavelength is 1100 mm when a power-source frequency is 27 MHz, 500 mm when 60 MHz, and 250 mm when 120 MHz.

In such a case, influence of the surface standing wave remarkably appears, and thus problems are caused, in that distribution of plasma density in a reaction chamber of the plasma CVD apparatus becomes uneven, and in-plane uniformity of quality and thickness in a thin film formed over a glass substrate is degraded.

Thus, it is an object of the present invention to form a thin film with high in-plane uniformity over a large-sized glass substrate using a plasma CVD apparatus. It is another object of the present invention to form a microcrystalline semiconductor as a thin film and to provide a TFT in which the microcrystalline semiconductor is at least partly included in a channel formation region or a semiconductor device including the TFT.

In the present invention, two or more high-frequency electric powers with different frequencies are supplied to an electrode for producing glow discharge plasma, which is provided in a reaction chamber. The high-frequency electric power is an alternating-current power. The high-frequency electric powers with different frequencies are supplied to produce glow discharge plasma, so that a thin film including a semiconductor or an insulating material is formed. One of the high-frequency electric powers (a first high-frequency electric power) is an electric power in a frequency band where the surface standing wave effect does not appear, and a high frequency with a wavelength of about 10 m or more is applied. In addition, a second high-frequency electric power has a shorter wavelength, that is, a higher frequency, than the first high-frequency electric power, and the second high-frequency electric power is added to the first high-frequency electric power.

An aspect of the present invention is to enable switching of the following cases freely when an insulating layer and a semiconductor layer for forming a TFT are manufactured. One of the cases is that two or more high-frequency electric powers with different frequencies are supplied to an electrode for producing glow discharge plasma, which is provided in a reaction chamber. The other case is that one high frequency electric power with a frequency is supplied thereto. When glow discharge plasma is produced by supplying the high-frequency electric powers with different frequencies, one of the high-frequency electric powers (a first high-frequency electric power) is an electric power in a frequency band where the surface standing wave effect does not appear, and a high frequency with a wavelength of about 10 m or more is applied. In addition, a second high-frequency electric power has a shorter wavelength, that is, a higher frequency, than the first high-frequency electric power, and the second high-frequency electric power is added to the first high-frequency electric power.

Such high-frequency electric powers with different frequencies (different wavelengths), which are superimposed on each other, are applied to an electrode of a plasma CVD apparatus, whereby uniformity of plasma can be attained without generating the surface standing wave effect of plasmas, and further, density of plasma can be increased.

Further, by supplying such two or more high-frequency electric powers with different frequencies, a thin film with high uniformity can be formed over a large-sized substrate. A high-frequency electric power which does not cause the surface standing wave and a high-frequency electric power belonging to the VHF band with a higher frequency than the above high-frequency electric power are supplied to produce plasma, whereby a thin film having homogeneity and high film quality can be formed over a large-sized substrate whose one side exceeds 2000 mm by a plasma CVD method. In order to form a thin film over the large-sized substrate exceeding 2000 mm, an electrode provided in a plasma CVD apparatus is necessary to have one side of 2000 mm or longer.

The case in which two or more high-frequency electric powers with different frequencies are supplied to an electrode for producing glow discharge plasma in a reaction chamber and the case in which one high-frequency electric power with a frequency is supplied thereto are enabled to be switched freely, whereby a process in which film quality is prioritized and a process in which the deposition rate is prioritized can be properly applied.

DETAILED DESCRIPTION OF THE INVENTION

Figure 1:
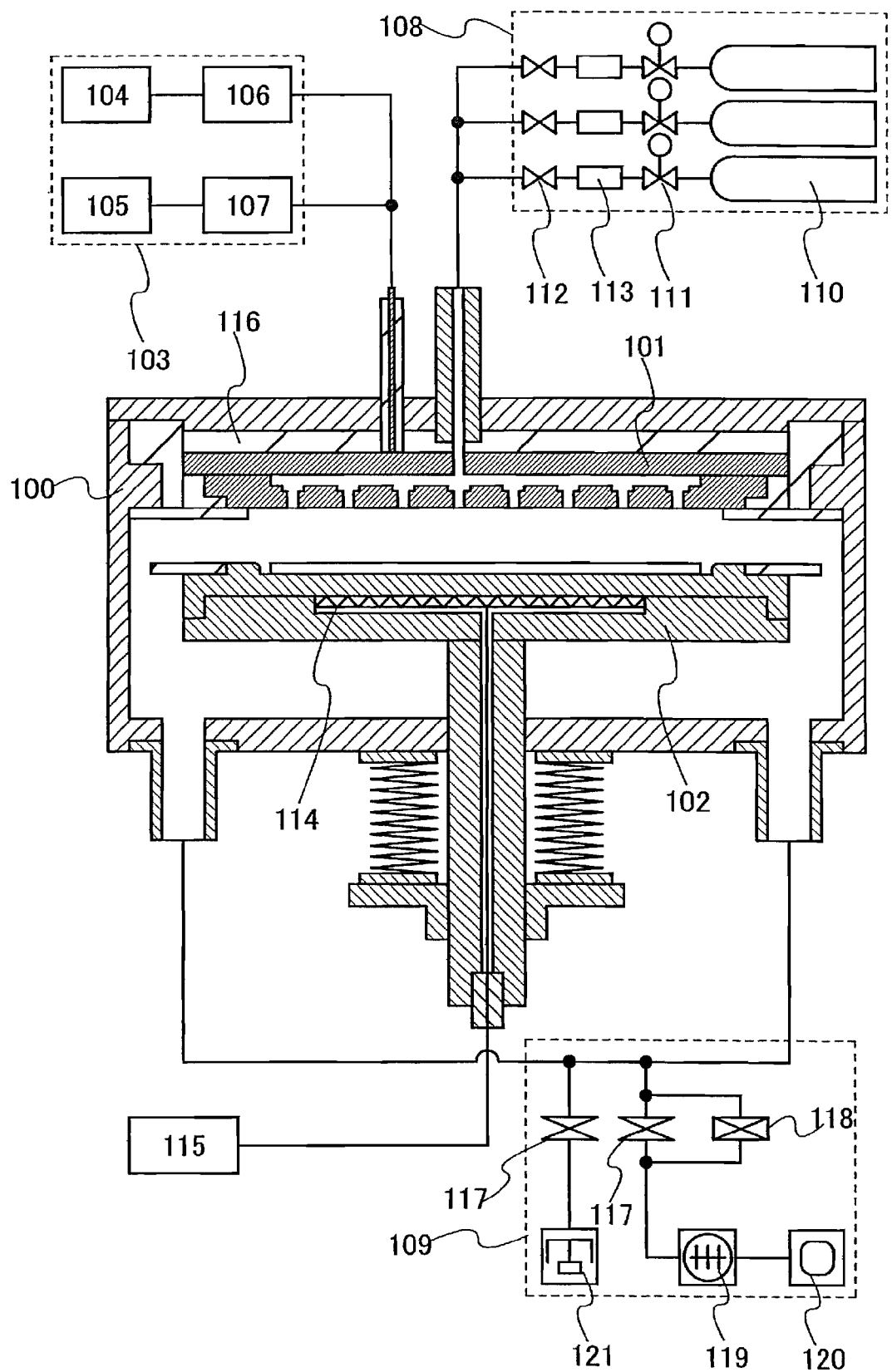
FIG. 1 is a diagram illustrating a structure of a reaction chamber in which a plurality of high-frequency electric powers are applied to one electrode.

Embodiment modes of the present invention will be described below with reference to the accompanying drawings. Note that the present invention is not limited to the description below, and it is easily understood by those skilled in the art that modes and details can be modified in various ways without departing from the purpose and the scope of the present invention. Accordingly, the present invention should not be interpreted as being limited to the description of the embodiment modes below. Note that like portions in the drawings may be denoted by the like reference numerals in structures of the present invention.

Embodiment Mode 1

FIG. 1 illustrates an example of a structure of a plasma CVD apparatus where high-frequency electric powers with different frequencies are applied. A reaction chamber 100 is formed of a material having rigidity, such as aluminum or stainless, and has a structure in which the inside can be evacuated to vacuum. In the reaction chamber 100, a first electrode 101 and a second electrode 102 are provided. The first electrode 101 and the second electrode 102 are disposed to face each other.

A high-frequency power supply means 103 is connected to the first electrode 101. The ground potential is supplied to the second electrode 102 which has such a shape that a substrate can be mounted. The first electrode 101 is insulated from the reaction chamber 100 with an insulating material 116, so that the high-frequency electric power does not leak. Although the first electrode 101 and the second electrode 102 have a capacitive coupled (parallel plate) structure in FIG. 1, another structure such as an inductively coupled structure can be applied as long as glow discharge plasma can be produced in the reaction chamber 100 by applying two or more high-frequency electric powers that are different from each other.

The high-frequency power supply means 103 includes a first high-frequency power source 104 and a second high-frequency power source 105 which can apply alternating-current powers, and a first matching box 106 and a second matching box 107 corresponding to the first high-frequency power source 104 and the second high-frequency power source 105, respectively. High-frequency electric powers outputted from the first high-frequency power source 104 and the second high-frequency power source 105 are both supplied to the first electrode 101. An output side of the first matching box 106 and/or the second matching box 107 may be provided with a band-pass filter so as not to make the high-frequency electric power from the other high-frequency power source inflow.

An alternating-current power supplied from the first high-frequency power source 104 is a high-frequency electric power with a wavelength of about 10 m or more, which is a frequency in the HF band of 3 MHz to 30 MHz inclusive, typically, 13.56 MHz. An alternating-current power supplied from the second high-frequency power source 105 is a frequency in the VHF band of higher than 30 MHz and 300 MHz or lower, in other words, a high-frequency electric power with a wavelength of less than 10 m.

A wavelength of the alternating-current power supplied from the first high-frequency power source 104 is three or more times as long as a length of one side of the first electrode 101. A wavelength of the alternating-current power supplied from the second high-frequency power source 105 is shorter than the wavelength of the alternating-current power supplied from the first high-frequency power source 104. In other words, the high-frequency electric power that does not cause the surface standing wave is supplied to the first electrode 101 so that glow discharge plasma is produced, and concurrently, the high-frequency power belonging to the VHF band is also supplied so that density of glow discharge plasma can be increased. As a result, a thin film with homogeneity and high quality can be formed over a large-sized substrate whose a long side exceeds 2000 mm.

Figure 2:
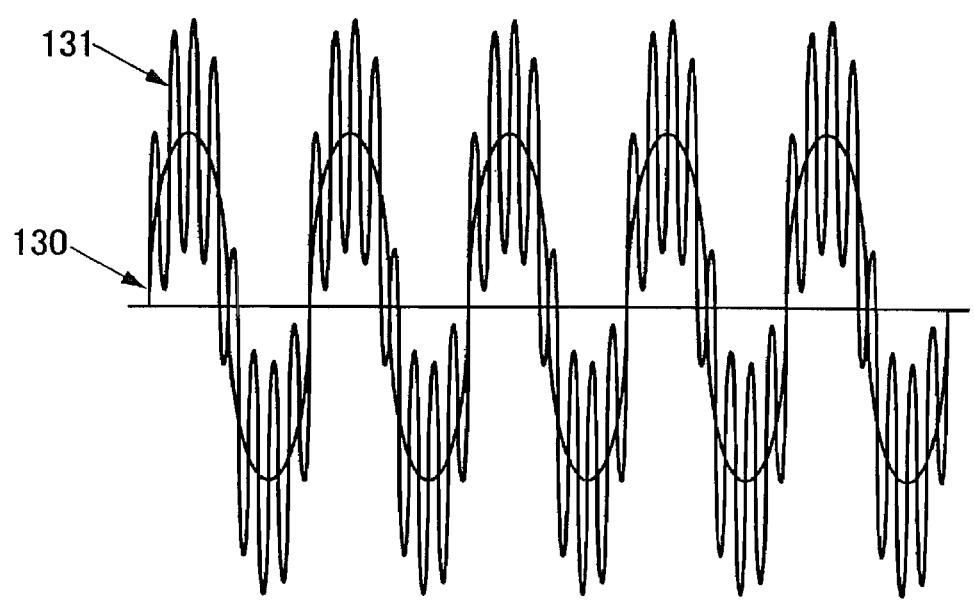
FIG. 2 is a schematic view showing one example of a waveform in a case where a high-frequency electric power from a first high-frequency power source and a high-frequency electric power from a second high-frequency power source are superimposed.

FIG. 2 illustrates an example of a waveform in a case where a high-frequency electric power 130 from the first high-frequency power source 104 and a high-frequency electric power 131 from the second high-frequency power source 105 are superimposed. An output waveform from the second high-frequency power source 105 that employs a frequency in the VHF band is superimposed on an output waveform from the first high-frequency power source 104 that employs a frequency in the HF band (typically 13.56 MHz), whereby density of plasma can be increased, and influence of the surface standing wave is not caused, so that in-plane uniformity of plasma density can be improved.

Figure 3:
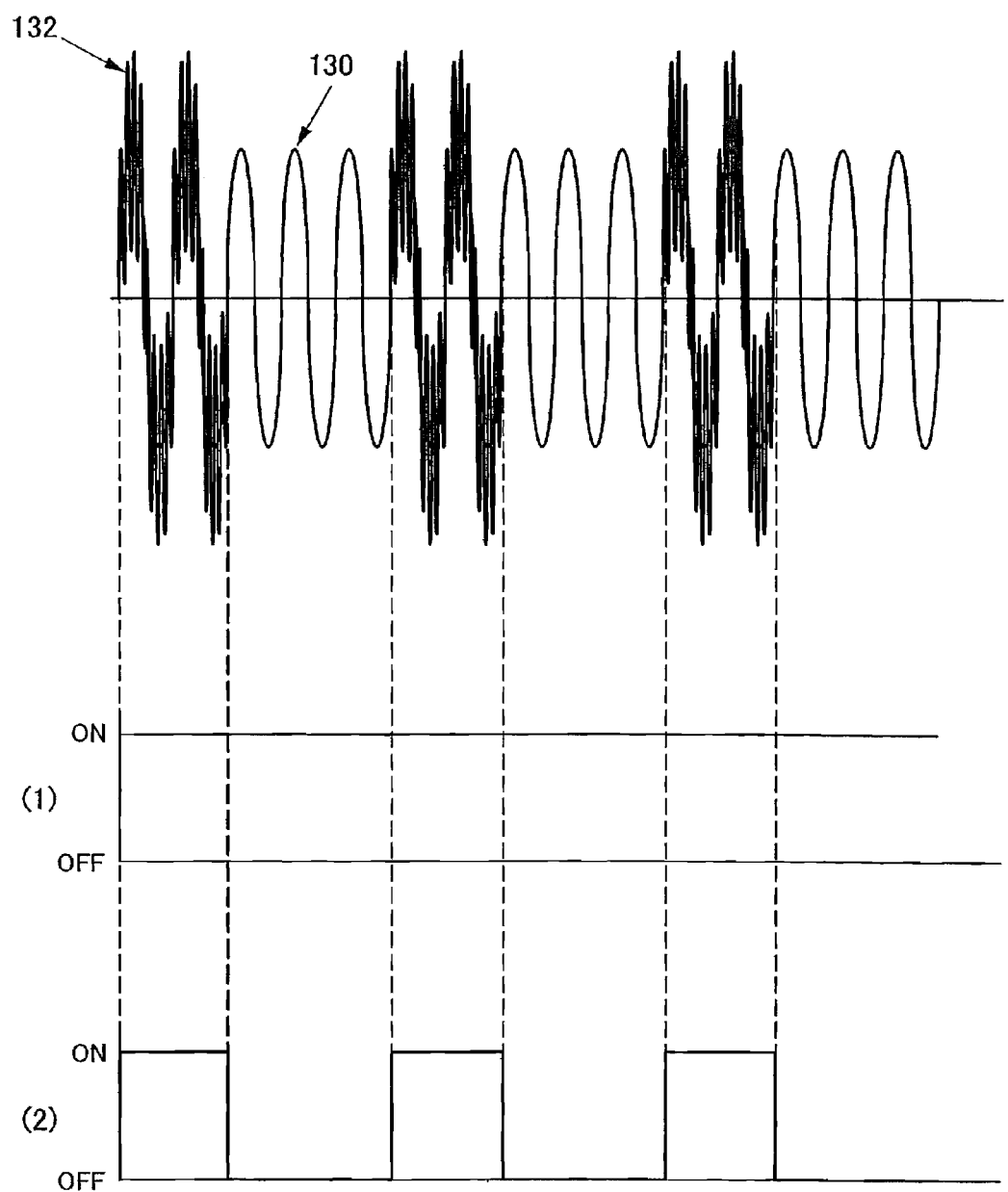
FIG. 3 is a schematic view showing one example of a waveform in a case where a high-frequency electric power from a first high-frequency power source and a high-frequency electric power from a second high-frequency power source are superimposed.

FIG. 3 is a schematic view of an example in which a power source oscillating pulses is employed as the second high-frequency power source 105, and a high-frequency electric power 132 of pulse oscillation and the high-frequency electric power 130 from the high-frequency power source 104 are used. Supplying the high-frequency electric power in the VHF band with pulses can prevent abnormal growth of particles in the vapor phase in film formation. It is necessary to consider the average resident time of gas molecules in order to suppress growth of particles, and the repetition rate of pulse may be set about 1 kHz to 100 kHz inclusive.

The first electrode 101 is also connected to a gas supply means 108. The gas supply means 108 includes a cylinder 110 filled with a reaction gas, a pressure adjusting valve 111, a stop valve 112, a mass flow controller 113, and the like. In the reaction chamber 100, the first electrode 101 has a surface which faces the substrate and which is processed into a shower-plate shape to have a plurality of holes. The reaction gas supplied to the first electrode 101 is supplied into the reaction chamber 100 through these holes from an inner hollow structure.

Figure 4:
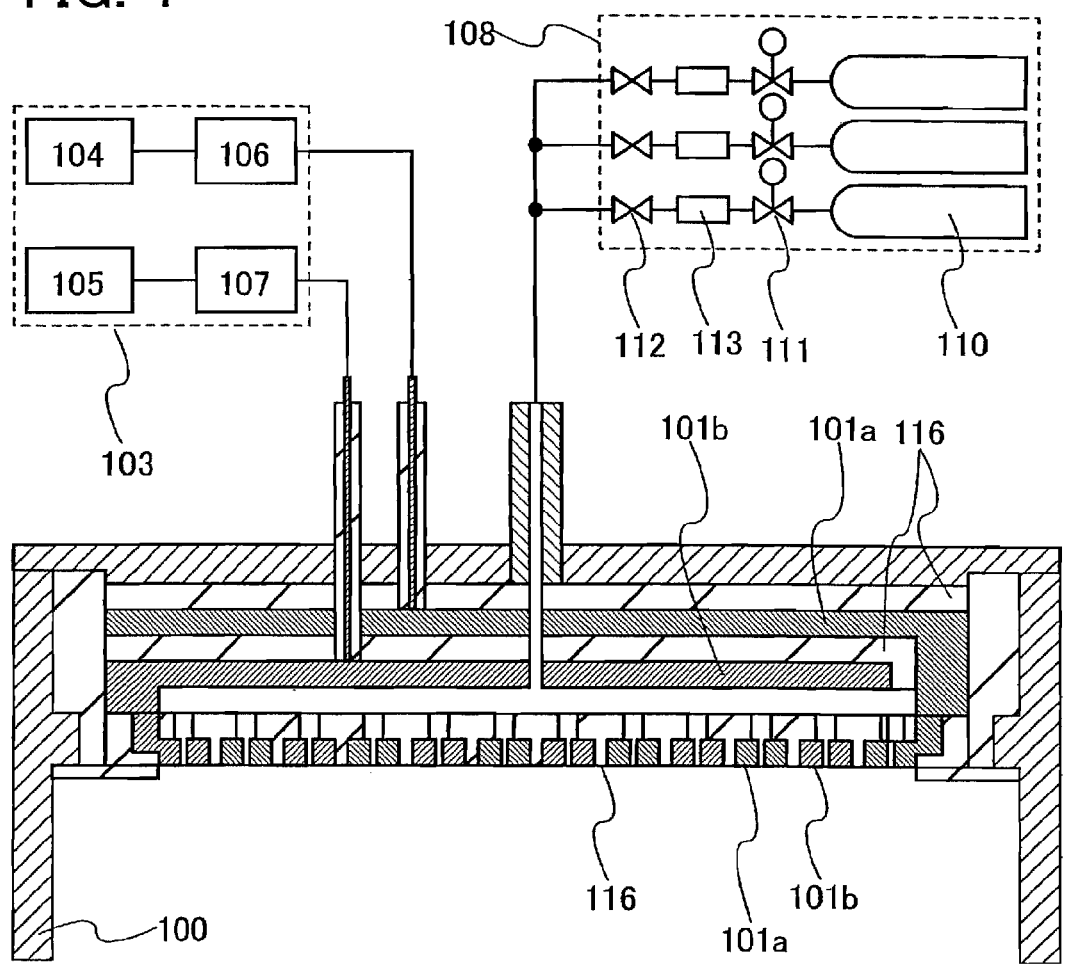
FIG. 4 is a diagram illustrating another example of an electrode structure in a reaction chamber in which a plurality of high-frequency electric powers are applied to one electrode.

FIG. 4 shows another structure of the first electrode 101. The first electrode 101 is constituted by a first electrode 101a to which a high-frequency electric power is supplied from the first high-frequency power source 104 and a first electrode 101b to which a high-frequency electric power is supplied from the second high-frequency power source 105. The first electrode 101a is disposed over the first electrode 101b with an insulating material 116 interposed therebetween. Small holes are provided on surfaces of the first electrode 101a and the first electrode 101b which face the substrate, and the first electrode 101a and the first electrode 101b are disposed in a comb-like form to engage with each other. In addition, the adjacent portions of the electrodes, which are disposed in a comb-like form, in the longitudinal direction are separated with the insulating material 116 so as not to be contacted. The first electrode 101 shown in FIG. 1 can be replaced by the structure shown in FIG. 4, and the similar effect can be obtained.

An evacuation means 109 connected to the reaction chamber 100 has functions of vacuum evacuation and controlling the reaction chamber 100 to be kept at a predetermined pressure in a case of supplying the reaction gas. The evacuation means 109 includes a butterfly valve 117, a conductance valve 118, a turbo molecular pump 119, a dry pump 120, and the like. In a case of arranging the butterfly valve 117 and the conductance valve 118 in parallel, the butterfly valve 117 is closed and the conductance valve 118 is made to operate to control the evacuation speed of the reaction gas, so that the pressure in the reaction chamber 100 can be controlled within a predetermined range. Moreover, operation of the butterfly valve 117 with higher conductance allows high-vacuum evacuation.

In the case of ultra-high vacuum evacuation at a pressure lower than $10^{-5}$ Pa as the degree of vacuum, a cryopump 121 is preferably used together. It is also effective to conduct vacuum evacuation with two turbo molecular pumps connected in series. Alternatively, in the case where the reaction chamber 100 is evacuated to ultra-high vacuum evacuation as the ultimate degree of vacuum, the inner wall of the reaction chamber 100 may be processed to have a mirror surface, and a heater for baking may be provided to decrease the amount of gas released from the inner wall.

A substrate heater 114, a temperature of which is controlled by a heater controller 115, is provided for the second electrode 102. When the substrate heater 114 is provided for the second electrode 102, a heat conduction method is employed, and a sheathed heater or the like is used for the substrate heater 114.

The distance between the first electrode 101 and the second electrode 102 can be adjusted as appropriate. This distance is set using a bellows so that the height of the second electrode 102 can be changed in the reaction chamber 100.

With the reaction chamber of the plasma CVD apparatus of this embodiment mode, a wide variety of thin films can be formed, such as an insulating layer typified by a silicon oxide layer or a silicon nitride layer; a semiconductor layer typified by a microcrystalline silicon layer or an amorphous silicon layer, and other thin films used in TFTs and photoelectric conversion devices. In particular, the reaction chamber of this plasma CVD apparatus is effectively used in the case of forming a thin film over a large-sized substrate with a long side exceeding 2000 mm. In order to form such a thin film over a large-sized substrate with a long side exceeding 2000 mm, a length of one side of a rectangular electrode provided for the plasma CVD apparatus is needed to be 2000 mm or longer. If the rectangular electrode has one side of 2000 mm or longer, the electrode may have an optional shape, which is also referred to as an approximate rectangle. Hereinafter, a method for forming a thin film will be described in time series with reference to FIG. 5.

Figure 5:
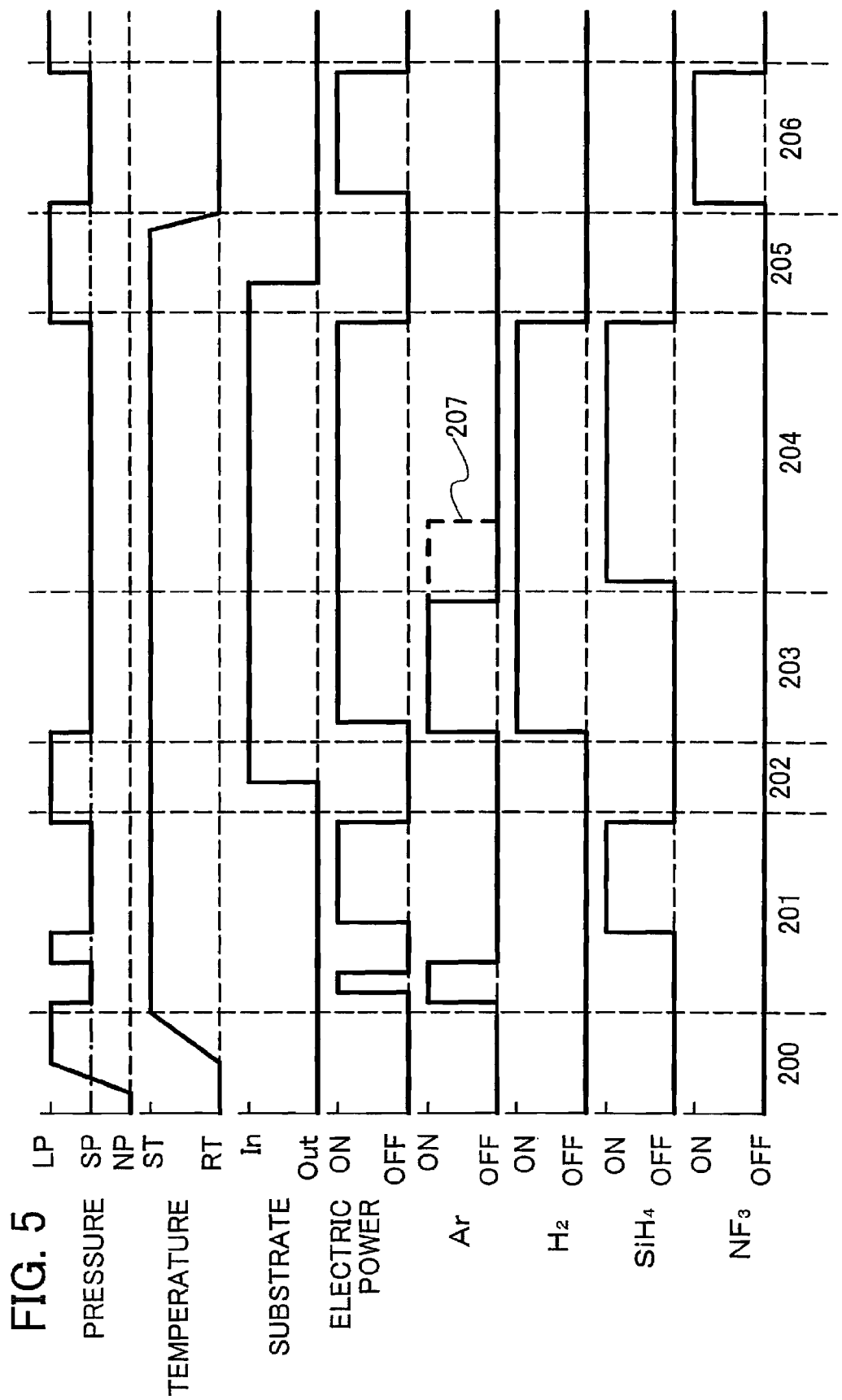
FIG. 5 is an example of a timing chart that illustrates steps of forming a microcrystalline silicon layer.

FIG. 5 is a typical example of a timing chart for describing steps of forming a microcrystalline silicon layer. Description of the chart shown in FIG. 5 begins with a vacuum evacuation step 200 of a reaction chamber from the atmospheric pressure to vacuum, which is followed by a precoating step 201, a substrate carrying-in step 202, a base pretreatment step 203, a film formation step 204, a substrate carrying-out step 205, and a cleaning step 206. These steps are described in time series.

First, vacuum evacuation of the reaction chamber is performed to a predetermined degree of vacuum. In a case of performing ultrahigh vacuum evacuation to obtain a pressure lower than $10^{-5}$ Pa as a degree of vacuum, evacuation is performed by using a turbo molecular pump and then vacuum evaporation is further performed by using a cryopump. In addition, the reaction chamber is preferably subjected to heat treatment to perform degassing treatment of the inner wall. In the case of vacuum evacuation, a heater for heating the substrate is also made to operate to stabilize the temperature. The substrate is heated at 100° C. to 300° C. inclusive, preferably at 120° C. to 220° C. inclusive.

In the precoating step 201, plasma treatment is preferably performed with supply of a rare gas such as argon, in order to remove gas adsorbed on the inner wall of the reaction chamber (atmospheric component such as oxygen or nitrogen, or an etching gas used for cleaning the reaction chamber). This treatment can decrease the ultimate degree of vacuum. Moreover, the precoating step 201 includes treatment in which the inner wall of the reaction chamber is covered with a film of the same kind as a film to be deposited over the substrate. Since this embodiment mode shows the steps of forming the microcrystalline silicon layer, formation of a silicon layer as a film covering the inner wall is performed. In the precoating step 201, after supplying silane, a high-frequency electric power is applied to produce glow discharge plasma. Silane reacts with oxygen, moisture, and the like. Therefore, oxygen and moisture in the reaction chamber can be removed by supplying silane and moreover, producing silane plasma.

The precoating step 201 is followed by the substrate carrying-in step 202. Since the substrate over which the microcrystalline silicon film is to be deposited is stored in a load chamber on which vacuum evaporation has been performed, the degree of vacuum does not deteriorate remarkably even if the substrate is carried in.

The base pretreatment step 203 is preferably performed because it is particularly effective treatment in the case of depositing the microcrystalline silicon layer. In a case of forming the microcrystalline silicon layer over a surface of a glass substrate, an insulating layer, or amorphous silicon, which is to be a surface on which a layer is deposited, by a plasma CVD method, an amorphous layer is formed at an initial stage of the deposition due to impurities, lattice mismatch, or the like. However, the base pretreatment step 203 can prevent formation of an amorphous layer. In order to reduce the thickness of the amorphous layer formed at the initial stage of the deposition as much as possible, or to eliminate the amorphous layer if possible, the base pretreatment step 203 is preferably performed. The base pretreatment is preferably performed by one or both rare gas plasma treatment and hydrogen plasma treatment. In the rare gas plasma treatment, a rare gas element with large mass is preferably used, such as argon, krypton, or xenon because such a rare gas element can remove oxygen, moisture, organic matters, metal elements, and the like attached to the surface on which a layer is deposited, by sputtering effect. The hydrogen plasma treatment is effective for removing the impurities adsorbed on the surface, by hydrogen radicals and for cleaning the surface by etching to the insulating layer or the amorphous silicon layer. Moreover, when both the rare gas plasma treatment and the hydrogen plasma treatment are performed, generation of microcrystalline nuclei is promoted.

In order to promote generation of microcrystalline nuclei, it is effective to supply a rare gas such as argon continuously until an initial step of film formation of the microcrystalline silicon layer as shown by a dashed line 207 in FIG. 5.

The film formation step 204 for forming the microcrystalline silicon layer is a step following the base treatment step 203. The microcrystalline silicon layer is formed by glow discharge plasma produced with use of supply of a reaction gas. As a reaction gas, such combination as silane and hydrogen; silane and a rare gas; or silane, hydrogen, and a rare gas can be used. Silane is diluted with hydrogen and/or a rare gas to be 10 to 2000 times thinner. Thus, a large amount of hydrogen and/or a rare gas is needed. In a case of forming an impurity semiconductor, a doping gas is added in addition to silane. The substrate is heated at 100° C. to 300° C. inclusive, preferably, 120° C. to 220° C. inclusive. A surface where the microcrystal silicon layer is grown is inactivated with hydrogen, and the deposition is preferably performed at 120° C. to 220° C. inclusive in order to promote growth of the microcrystalline silicon.

The glow discharge plasma is produced by applying a first high-frequency electric power and a second high-frequency electric power which are superimposed on each other. The first high-frequency electric power has a frequency in the HF band of 3 MHz to 30 MHz inclusive, typically 13.56 MHz, and the second high-frequency electric power has a frequency in the VHF band of higher than 30 MHz and 300 MHz or lower as shown in this embodiment mode. The glow discharge plasma is produced by supplying the first high-frequency electric power that does not cause the surface standing wave, and density of plasma is attempted to be increased by supplying the second high-frequency electric power belonging to the VHF band, whereby it becomes possible to form a thin film with homogeneity and high quality over a large-sized substrate whose long side exceeds 200 mm. In order to form a thin film over a large-sized substrate whose long side exceeds 2000 mm, an electrode provided for a plasma CVD apparatus needs one side of 2000 mm or longer.

The precoating step 201 can prevent the microcrystalline silicon layer from taking in the metal constituting the reaction chamber as the impurity. In other words, covering the inside of reaction chamber with silicon can prevent the reaction chamber from being etched by plasma and can decrease the concentration of the impurity such as metal included in the microcrystalline silicon layer.

In the film formation step 204, helium may be added as a reaction gas. Helium has the highest ionization energy among all the gases, which is 24.5 eV, and has a metastable state at about 20 eV, which is a little lower than the ionization energy. Therefore, only 4 eV, which corresponds to the difference therebetween, is necessary for ionization while keeping discharge, and stable discharge can be continued. In addition, a discharge starting voltage has the lowest voltage in all the gases. In accordance with such characteristics, helium can maintain plasma stably. Further, the plasma density can be uniformed even on a large-sized substrate over which the microcrystalline silicon layer is deposited, and of the uniform microcrystalline silicon layer can be deposited.

After formation of the microcrystalline silicon is finished, the supply of the reaction gas such as silane and/or hydrogen and supply of the high-frequency electric power are stopped, and then the substrate carrying-out step 205 is performed. In the case of performing the film-formation treatment successively on another substrate, the same treatment is performed from the substrate carrying-in step 202. The cleaning step 206 is performed to remove the film or powder attached inside the reaction chamber.

In the cleaning step 206, plasma etching is performed by supplying an etching gas typified by $NF_3$ or $SF_6$. Alternatively, a gas which can perform etching without using plasma, such as $ClF_3$ may be supplied. The cleaning step 206 is preferably performed on the condition that the temperature is decreased by turning off the substrate heater 114, in order to suppress the generation of reacted by-product by etching. After the cleaning step 206 is finished, the precoating step 201 is performed again, which may be followed by the similar process.

Although in this embodiment mode, the method for forming a microcrystalline silicon layer has been described with reference to FIG. 5, this embodiment mode is not limited thereto, and a wide variety of thin films can be formed by changing the reaction gas. The formation of the semiconductor layer of this embodiment mode can be replaced by formation of amorphous silicon, amorphous silicon germanium, amorphous silicon carbide, microcrystalline silicon germanium, microcrystalline silicon carbide, or the like. The formation of the insulating layer of this embodiment mode can be replaced by formation of silicon oxide, silicon nitride, silicon oxynitride, silicon nitride oxide, or the like.

Note that silicon oxynitride contains more oxygen than nitrogen. For example, it contains oxygen at concentration ranging from 55 to 65 at. %, nitrogen at concentration ranging from 1 to 20 at. %, silicon at concentration ranging from 25 to 35 at. % and hydrogen (and/or an OH group) at concentration ranging from 0.1 to 10 at. %. Further, silicon nitride oxide contains more nitrogen than oxygen. For example, it contains oxygen at concentration ranging from 15 to 30 at. %, nitrogen at concentrations ranging from 20 to 35 at. %, silicon at concentration ranging from 25 to 35 at. %, and hydrogen (and/or an OH group) at concentration ranging from 15 to 25 at. %.

According to this embodiment mode, a thin film with high uniformity can be formed over a large-sized substrate.

Embodiment Mode 2

This embodiment mode will exemplify a structure of a plasma CVD apparatus suitable for formation of a gate insulating layer and a semiconductor layer included in a TFT, as an example of the plasma CVD apparatus that employs the reaction chamber shown in Embodiment Mode 1.

Figure 6:
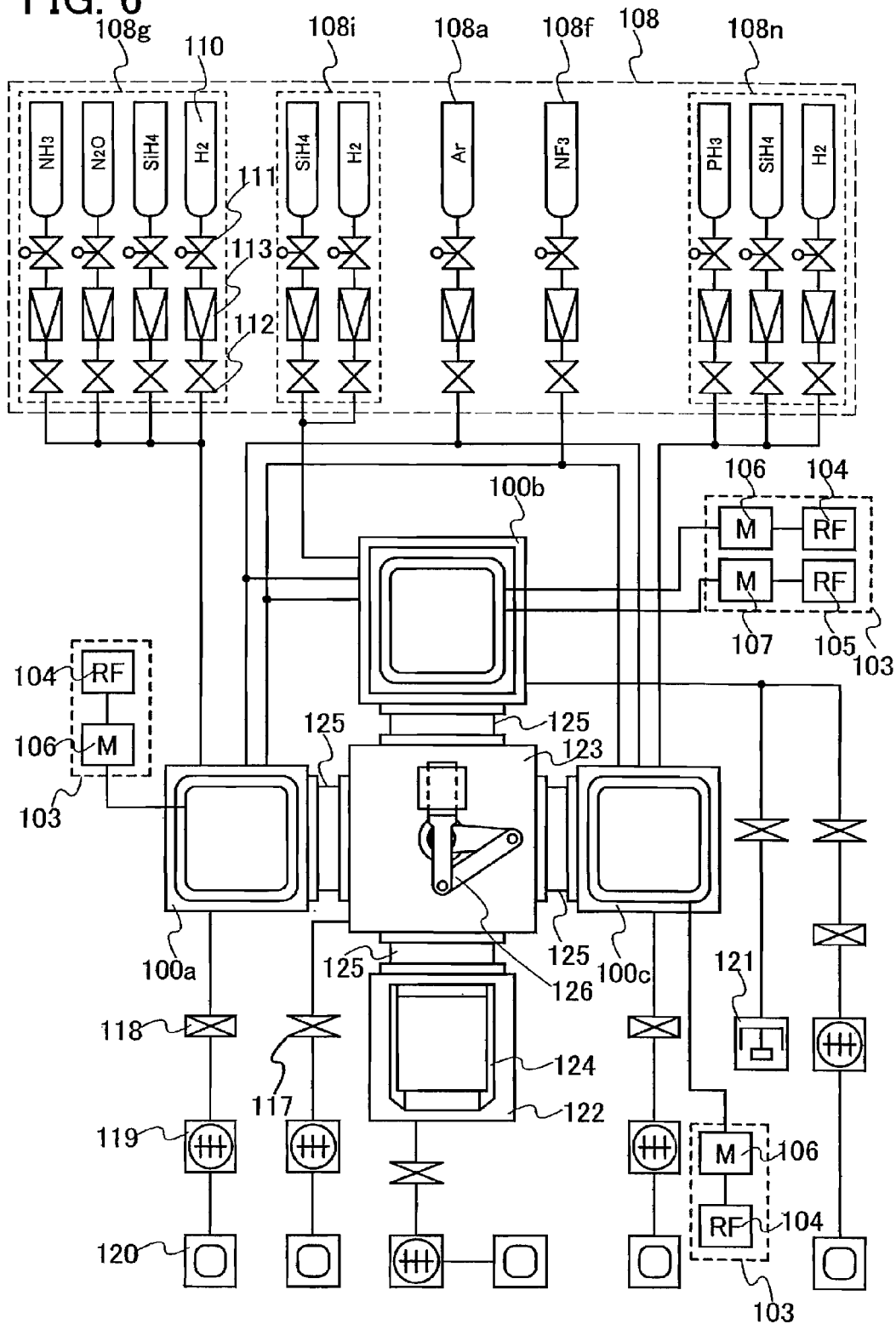
FIG. 6 is a diagram illustrating a structure of a multi-chamber plasma CVD apparatus provided with a plurality of reaction chambers.

FIG. 6 illustrates an example of a multi-chamber plasma CVD apparatus provided with a plurality of reaction chambers. This apparatus has a common chamber 123, a load/unload chamber 122, a first reaction chamber 100a, a second reaction chamber 100b, and a third chamber 100c. The plasma CVD apparatus has a single-wafer structure in which substrates loaded in a cassette 124 in the load/unload chamber 122 are carried in and out of each chamber by a transport mechanism 126 of the common chamber 123 one by one. Gate valves 125 are provided between the common chamber 123 and each chamber, so that treatment conducted in the chambers does not interfere with each other.

Each reaction chamber is used for a different purpose depending on the kinds of thin films to be formed. For example, the first reaction chamber 100a is used for forming an insulating layer such as a gate insulating layer, the second reaction chamber 100b is used for forming a microcrystalline semiconductor layer which forms a channel, and the third reaction chamber 100c is used for forming an impurity semiconductor layer with one conductivity type which forms a source and a drain. As a matter of course, the number of reaction chambers is not limited thereto, and it can be increased or reduced as needed. Further, as described above, one film may be formed in one reaction chamber, and alternatively a plurality of films can be formed in one reaction chamber.

Turbo molecular pumps 119 and dry pumps 120 as evacuation means are connected to the reaction chambers. The evacuation means is not limited to the combination of these vacuum pumps, and may be another vacuum pump as long as the evacuation can be performed to attain a degree of vacuum of about from $10^{-1}$ Pa to $10^{-5}$ Pa. The second reaction chamber 110b used for forming the microcrystalline semiconductor layer is connected to a cryopump 121 which evacuates the second reaction chamber 110b to ultrahigh vacuum. A butterfly valve 117 may be provided between the vacuum pump and each reaction chamber to block vacuum evacuation. A conductance valve 118 may be provided between the vacuum pump and each reaction chamber to control the exhaust velocity, so that pressure in each reaction chamber can be adjusted.

A gas supply means 108 includes cylinders 110 filled with a semiconductor material gas typified by silane or a rare gas, pressure control valves 111, stop valves 112, mass flow controllers 113, and the like. A gas supply means 108g is connected to the first reaction chamber 100a to supply a gas for forming a gate insulating layer. A gas supply means 108i is connected to the second reaction chamber 100b to supply a gas for forming a microcrystalline semiconductor layer. A gas supply means 108n is connected to the third reaction chamber 100c to supply a gas for forming an n-type semiconductor layer, for example. A gas supply means 108a supplies argon, and a gas supply means 108f supplies an etching gas used for cleaning of the reaction chambers. The gas supply means 108a and 108f are used as common lines in the reaction chambers.

High-frequency power supply means 103 are connected to the reaction chambers in order to produce glow discharge plasma. Each high-frequency power supply means 103 includes a high-frequency power source and a matching box. The high-frequency power supply means 103 connected to the second reaction chamber 100b includes a first high-frequency power source 104, a second high-frequency power source 105, a first matching box 106, and a second matching box 107, similarly to Embodiment Mode 1, whereby a thin film with high uniformity can be formed. A thin film with high uniformity can be formed over substrates with any sizes when such a reaction chamber provided with the high-frequency power supply means has a structure corresponding to various kinds of substrates with sizes of 300 mm×400 mm called first generation, 550 mm×650 mm in third generation, 730 mm×920 mm in fourth generation, 1000 mm×1200 mm in fifth generation, 2450 mm×1850 mm in sixth generation, 1870 mm×2200 mm in seventh generation, 2000 mm×2400 in eighth generation, 2450 mm×3050 mm in ninth generation, 2850 mm×3050 mm in tenth generation, and the like.

Figure 7:
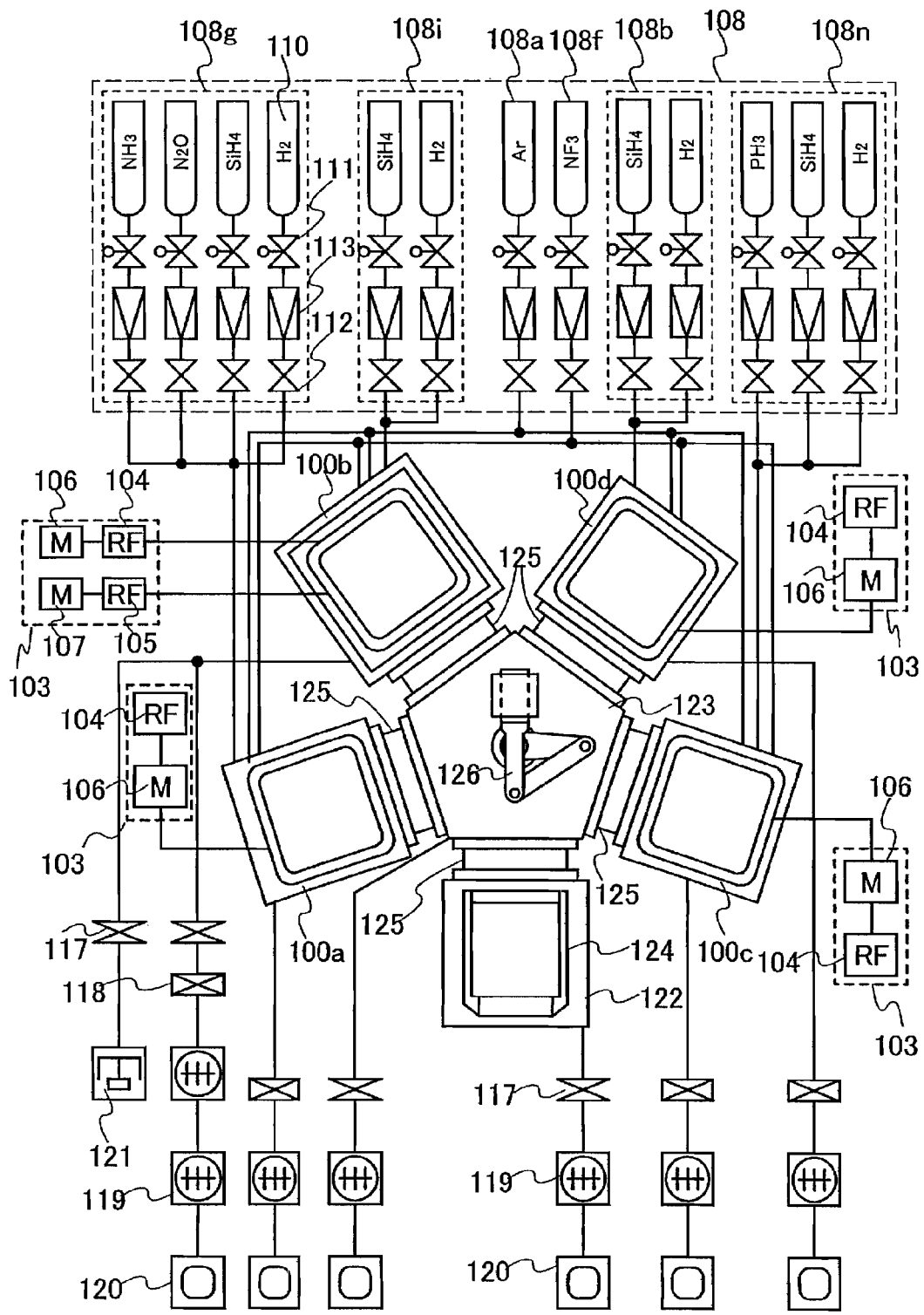
FIG. 7 is a diagram illustrating a structure of a multi-chamber plasma CVD apparatus provided with a plurality of reaction chambers.
Figure 8:
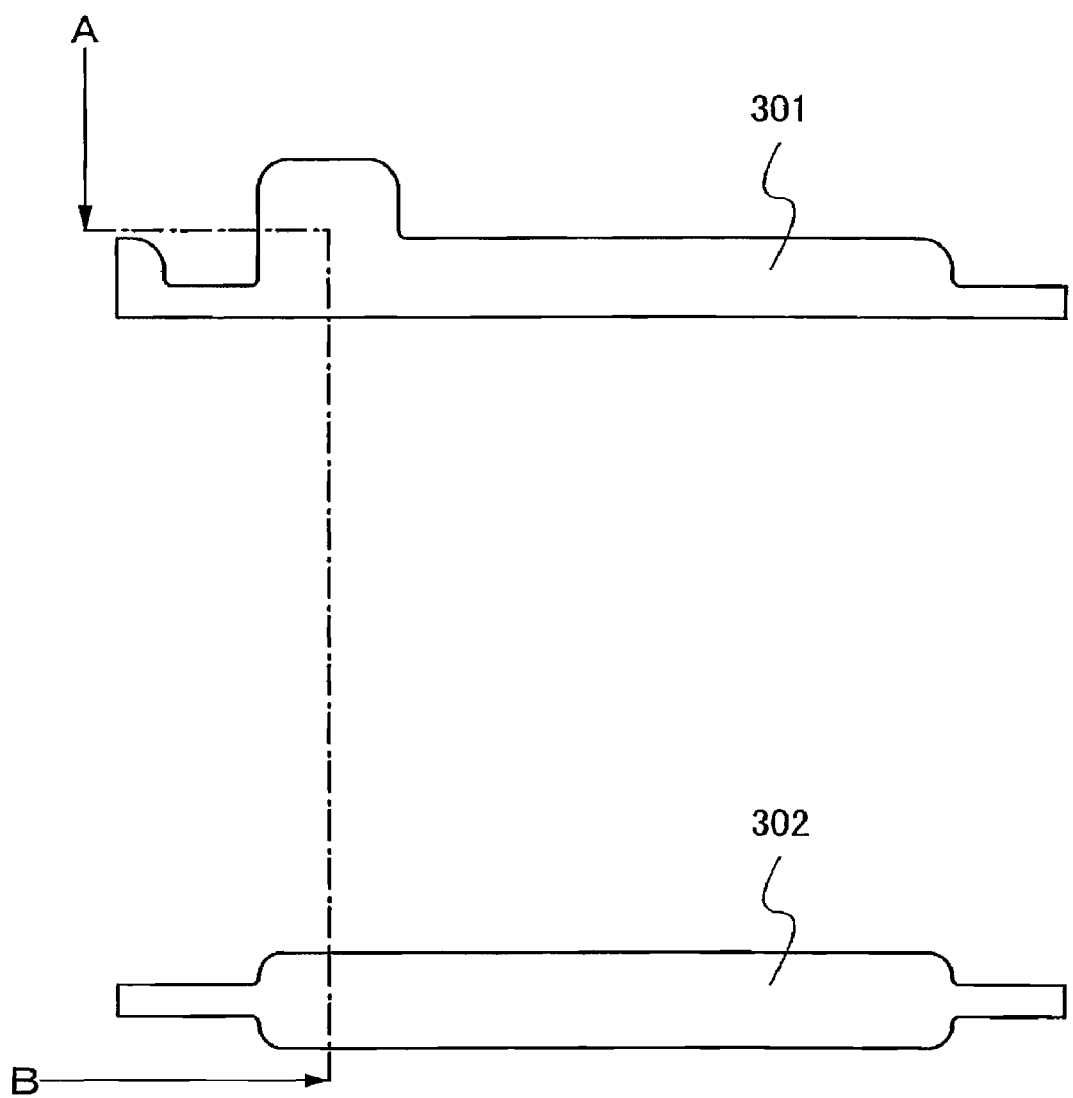
FIG. 8 is a plane view illustrating one manufacture process of a display device including a TFT in which a channel is formed using a microcrystalline semiconductor layer in Embodiment Mode 3.
Figure 9:
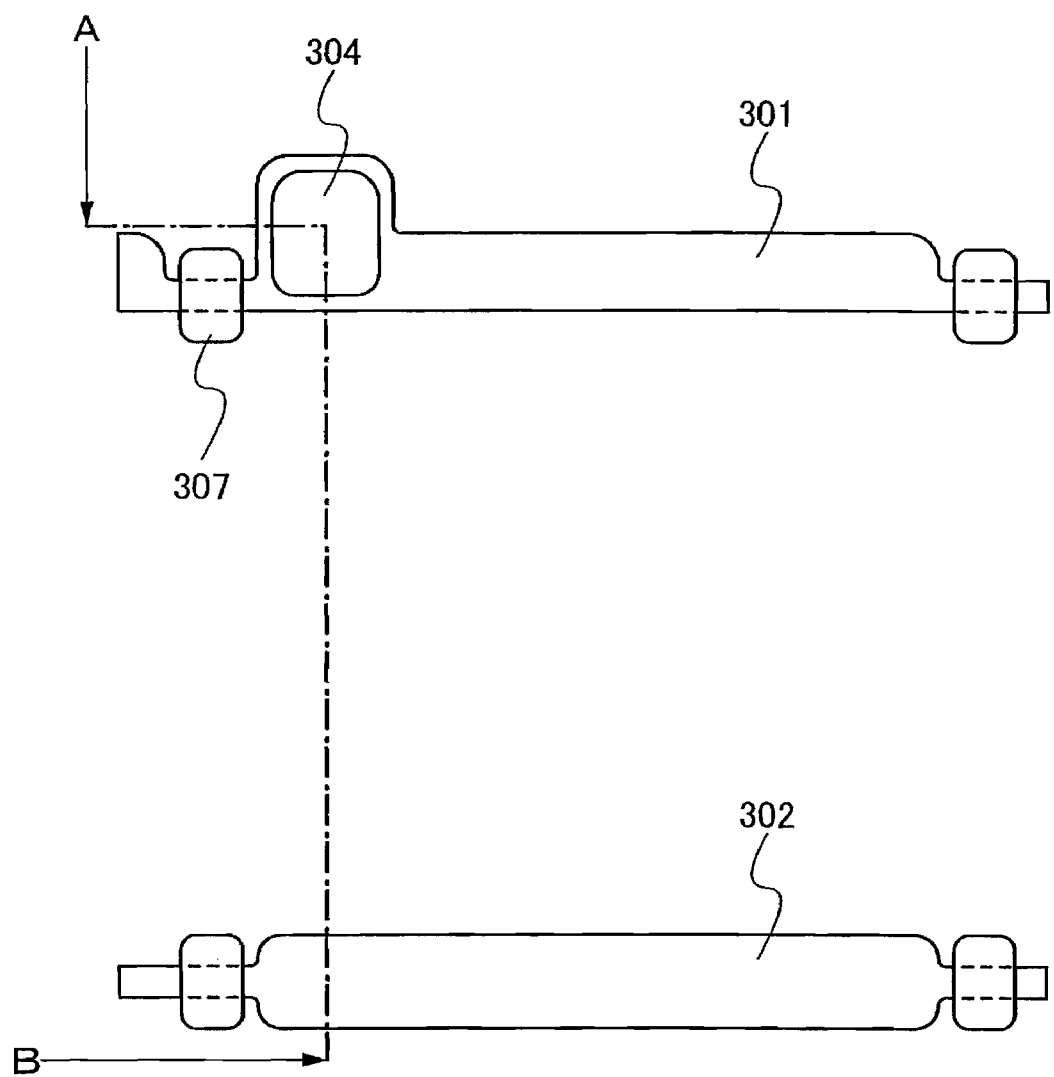
FIG. 9 is a plane view illustrating one manufacture process of a display device including a TFT in which a channel is formed using a microcrystalline semiconductor layer in Embodiment Mode 3.

FIG. 7 illustrates a structure in which a fourth reaction chamber 100d is added to the structure of the multi-chamber plasma CVD apparatus of FIG. 6. A gas supply means 108b is connected to the fourth reaction chamber 100d. The high-frequency power supply means and the evacuation means have the same structure with those of FIG. 6. Each reaction chamber can be used for a different purpose depending on the kinds of thin films to be formed. For example, the first reaction chamber 100a can be used for forming an insulating layer such as a gate insulating layer, the second reaction chamber 100b can be used for forming a microcrystalline semiconductor layer which forms a channel, the fourth reaction chamber 100d can be used for forming a buffer layer for protecting the semiconductor layer for formation of a channel, and the third reaction chamber can be used for forming an impurity semiconductor layer with one conductivity type which forms a source and a drain. Since each thin film has an optimum temperature for formation, the reaction chambers are provided separately, so that formation temperatures can be easily controlled. Furthermore, since the same kind of film can be repeatedly formed, influence of residual impurities can be eliminated.

As described in this embodiment mode, a plurality of reaction chambers shown in FIG. 6 or FIG. 7 are used and connected with a common chamber, whereby a plurality of different layers can be successively stacked without being exposed to air. Hereinafter, a process of manufacturing a TFT with use of such a plasma CVD apparatus will be described.

Embodiment Mode 3

This embodiment mode will exemplify an example of a method for manufacturing a TFT, provided in a pixel in a display device, in which a channel formation region is formed using a microcrystalline silicon layer with use of the plasma CVD apparatus described in Embodiment Mode 1 and Embodiment Mode 2.

FIG. 8, FIG. 9, FIG. 10, and FIG. 11 are plane views of a pixel, and FIG. 12, FIG. 13, FIG. 14, FIG. 15, and FIG. 16 are cross-sectional views taken along lines A-B of the plane views. Hereinafter, description is made with reference to these plane views and cross-sectional views as appropriate.

(1) Formation of Gate Electrode and Capacitor Electrode

A flat-plate substrate having an insulating surface, such as a glass substrate, is applied as an element substrate 300 over which a TFT is manufactured. A gate electrode 301 and a capacitor electrode 302 are formed over the element substrate 300 (see FIG. 8 and FIG. 12).

The gate electrode 301 and the capacitor electrode 302 are each formed of a metal material. As a metal material, aluminum, chromium, titanium, tantalum, molybdenum, copper, or the like is employed. The gate electrode 301 and the capacitor electrode 302 are preferably formed of aluminum or a stacked structure of aluminum and barrier metal. As a barrier metal, refractory metal such as titanium, molybdenum, or chromium is applied. The barrier metal is preferably provided so as to prevent hillock or oxidation of aluminum.

Figure 13:
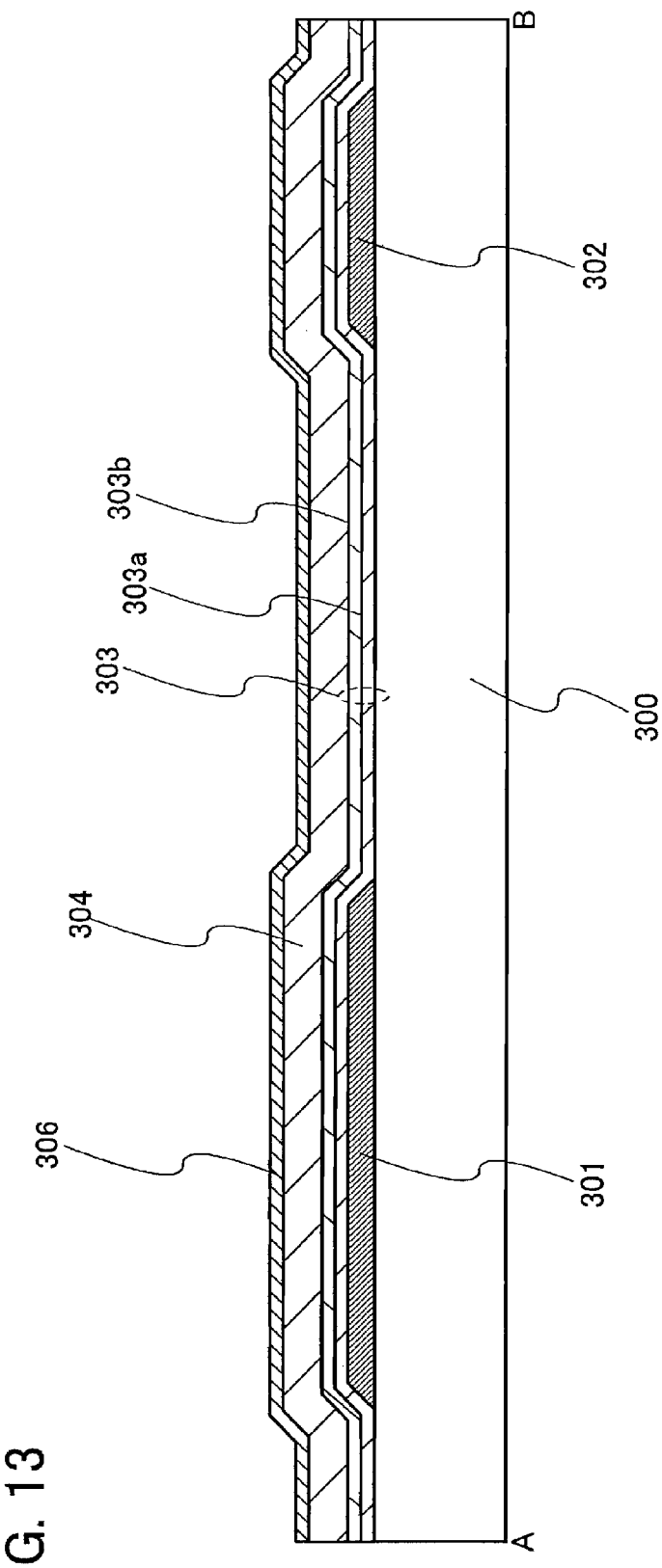
FIG. 13 is a cross-sectional view illustrating one manufacture process of a display device including a TFT in which a channel is formed using a microcrystalline semiconductor layer in Embodiment Mode 3.
Figure 14:
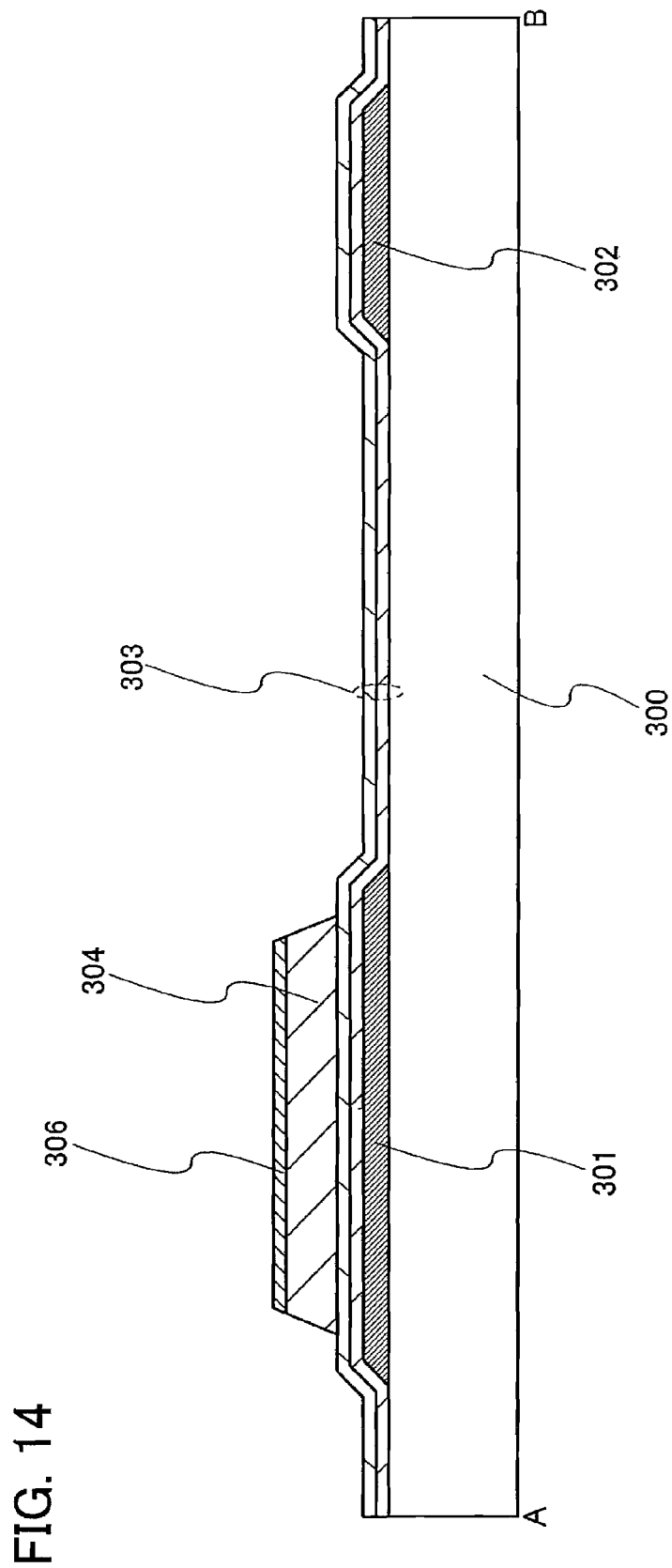
FIG. 14 is a cross-sectional view illustrating one manufacture process of a display device including a TFT in which a channel is formed using a microcrystalline semiconductor layer in Embodiment Mode 3.

(2) Formation of Gate Insulating Layer, Microcrystalline Silicon Layer, and Impurity Semiconductor Layer After the gate electrode 301 and the capacitor electrode 302 are formed, a gate insulating layer 303, a microcrystalline silicon layer 304, and an impurity semiconductor layer 306 are formed over the element substrate 300 (see FIG. 13). These thin films can be formed to be stacked successively without each interface being exposed to air by using the plasma CVD apparatus described in Embodiment Mode 1 and Embodiment Mode 2.

The gate insulating layer 303 is formed of an insulating material such as silicon nitride, silicon oxide, silicon nitride oxide, silicon oxynitride, nitride aluminum, or aluminum nitride oxide. In the preferable formation of the gate insulating layer 303, the base treatment step 203 is performed, and then the film formation step 204 is performed as described in Embodiment Mode 1 with reference to FIG. 5. First, the element substrate 300 over which the gate electrode 301 and the capacitor electrode 302 are formed is carried in the reaction chamber having the structure as described in FIG. 6. The reaction chamber is preferably coated with a film of the same kind as the gate insulating layer in advance in order to prevent a metal impurity or the like on an inner wall of the reaction chamber from being mixed into the gate insulating layer 303.

The gate insulating layer 303 is formed using a reaction gas of a silicon hydride gas such as silane and a gas containing oxygen or nitrogen. Then, a high-frequency electric power in the HF band (3 MHz to 30 MHz inclusive, typically, 13.56 MHz) and a high-frequency electric power in the VHF band (higher than 30 MHz and 300 MHz or lower) are superimposed on each other and applied to produce glow discharge plasma. Application of high-frequency electric powers in different frequency bands can make plasma density increase and in-plane uniformity to the element substrate 300 increase. The gate insulating layer 303 is preferably formed at a temperature of 200° C. to 400° C. inclusive, and with high plasma density, a dense insulating layer with high withstand voltage can be formed.

As an example of a structure of the gate insulating layer 303, a stacked structure can be provided, in which silicon nitride (or silicon nitride oxide) is formed as a first gate insulating layer 303a over the gate electrode 301 and the capacitor electrode 302, and silicon oxide (or silicon oxynitride) is formed as a second gate insulating layer 303b thereover. The gate insulating layer 303 is formed with a plurality of layers in such a manner, whereby the gate insulating layer 303 can have a plurality of functions. In other words, silicon nitride (or silicon nitride oxide) provided as the first gate insulating layer 303a can prevent impurity diffusion from the element substrate 300 and also prevent, as another effect, oxidation of the gate electrode 301. Further, when the gate electrode 301 is formed of aluminum, hillock of aluminum can be prevented. Silicon oxide (or silicon oxynitride) provided as the second gate insulating layer 303b has an effect to increase adhesion between the gate insulating layer and the microcrystalline silicon layer formed thereover and to ease stress distortion of the first gate insulating layer 303a. The first gate insulating layer 303a is preferably formed to have a thickness of 10 nm to 100 nm, and the second gate insulating layer 303b is preferably formed to have a thickness of 50 nm to 150 nm.

In the preferable formation of the microcrystalline silicon layer 304, the base treatment step 203 is performed, and then the film formation step 204 of microcrystalline silicon is performed as described with reference to FIG. 5. In this case, the gate insulating layer 303 corresponds to a base of the microcrystalline silicon layer 304. In formation of the microcrystalline silicon layer 304, oxygen inhibits crystallization and functions as donors when oxygen is taken into a silicon layer. Thus, in a case where the base is silicon oxide or the like, silicon nitride with a thickness of 5 nm to 10 nm may be formed as an uppermost layer of the gate insulating layer 303. In any case, it is preferable to remove moisture or an absorbed impurity on the surface of the gate insulating layer 303 by either rare gas plasma treatment or hydrogen plasma treatment or the both as the base treatment step 203.

The microcrystalline silicon layer 304 is formed utilizing a mixed gas of a silicon hydride gas such as silane with hydrogen and/or a rare gas and glow discharge plasma that is produced by applying high-frequency electric powers in the HF band (3 MHz to 30 MHz inclusive, typically, 13.56 MHz) and in the VHF band (higher than 30 MHz and about 300 MHz or lower) which are superimposed on each other. A typical silicon hydride gas is $SiH_4$ or $Si_2H_6$. In addition, as a silicon halide gas or a silicon hydride halide gas, $SiCl_4$, $SiF_4$, $SiH_2Cl_2$, $SiHCl_3$, or the like can be used. Silane or the like is diluted with hydrogen and/or a rare gas to be 10 to 2000 times thinner. Therefore, a large amount of hydrogen and/or a rare gas is needed. The substrate is heated at 100° C. to 300° C. inclusive, preferably 120° C. to 220° C. inclusive. A surface where the microcrystalline silicon layer is grown is inactivated with hydrogen, and deposition is preferably performed at 120° C. to 220° C. inclusive in order to promote growth of the microcrystalline silicon.

The thickness of the microcrystalline silicon layer 304 may be 50 nm to 500 nm (preferably, 100 nm to 250 nm). Note that the inside of the reaction chamber may be coated with a film of the same or similar kind as the microcrystal silicon layer 304, such as a silicon layer, whereby the proportion of degassing from the inner wall of the reaction chamber is decreased, and contamination due to a metal impurity from the inner wall of the reaction chamber can be prevented. Further, before the plasma is produced, it is desirable that treatment be performed in which silane is supplied to be reacted with residual oxygen, moisture, and the like in the treatment chamber so that the cleaning level is improved.

Further, hydride of carbon such as $CH_4$ or $C_2H_6$, germanium hydride such as $GeH_4$, or germanium fluoride such as $GeF_4$ may be mixed into a gas of silane or the like, so that the energy band width can be adjusted to be 1.5 eV to 2.4 eV inclusive, or 0.9 eV to 1.1 eV inclusive. When carbon or germanium is added to silicon included in the microcrystalline silicon layer, temperature characteristics of a TFT can be changed.

An impurity imparting one conductivity type for the purpose of valence electron control is added to the impurity semiconductor layer 306. In the case of forming the n-type impurity semiconductor layer 306, phosphorus or arsenic is added thereto, and in the case of forming the p-type impurity semiconductor layer 306, boron is added thereto. The typical example of the impurity semiconductor layer 306 is an amorphous silicon layer or a microcrystalline silicon layer. In preferable formation of the impurity semiconductor layer 306, the base treatment step 203 and then the film formation step 204 are performed as described in Embodiment Mode 1 with reference to FIG. 5.

(3) Processing of Semiconductor Layer

The microcrystalline silicon layer 304 and the impurity semiconductor layer 306 formed over almost the whole surface of the element substrate 300 are etched and processed into the predetermined pattern. The microcrystalline silicon layer 304 and the impurity semiconductor layer 306 are processed by etching so as to wholly or at least partially overlap with the gate electrode 301 (see FIG. 9 and FIG. 14). In such a structure, light can be blocked at a channel portion of a TFT, and the gate voltage can work on the microcrystalline silicon layer 304 uniformly without any influence of light. End portions of the microcrystalline silicon layer 304 and the impurity semiconductor layer 306 are processed into taper shapes, whereby step coverage with a wiring layer formed thereover is improved, and leakage current flowing in the end portion of the semiconductor layer is reduced. Note that a semiconductor layer 307 is provided to overlap the gate electrode 301 and the capacitor electrode 302 at portions corresponding to intersections of the wiring layer formed in the subsequent step with the gate electrode 301 and the capacitor electrode 302, so that the step coverage with the wiring layer at the intersections can be improved.

(4) Formation of Wiring Layer and Protective Layer

Figure 10:
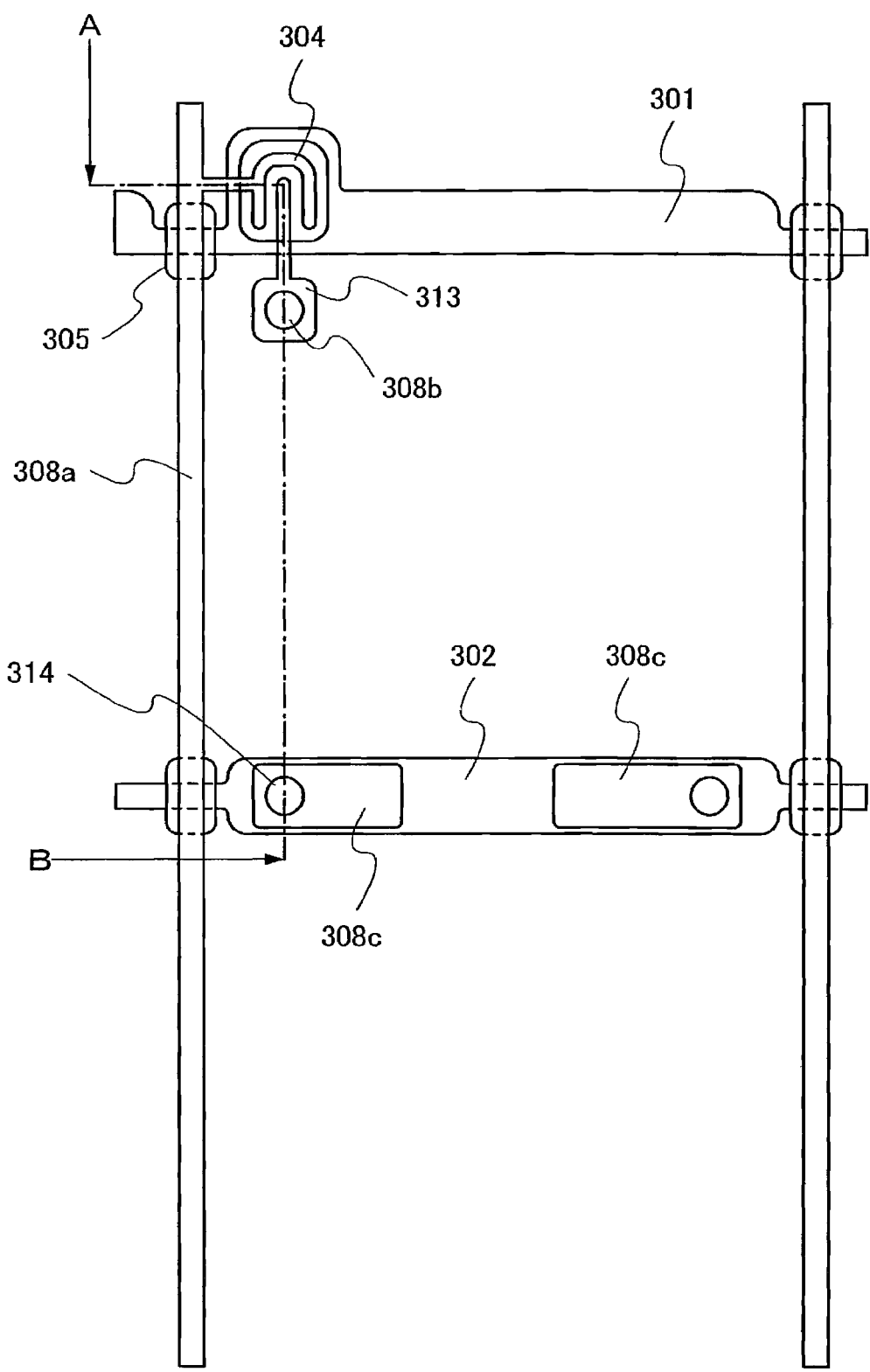
FIG. 10 is a plane view illustrating one manufacture process of a display device including a TFT in which a channel is formed using a microcrystalline semiconductor layer in Embodiment Mode 3.
Figure 15:
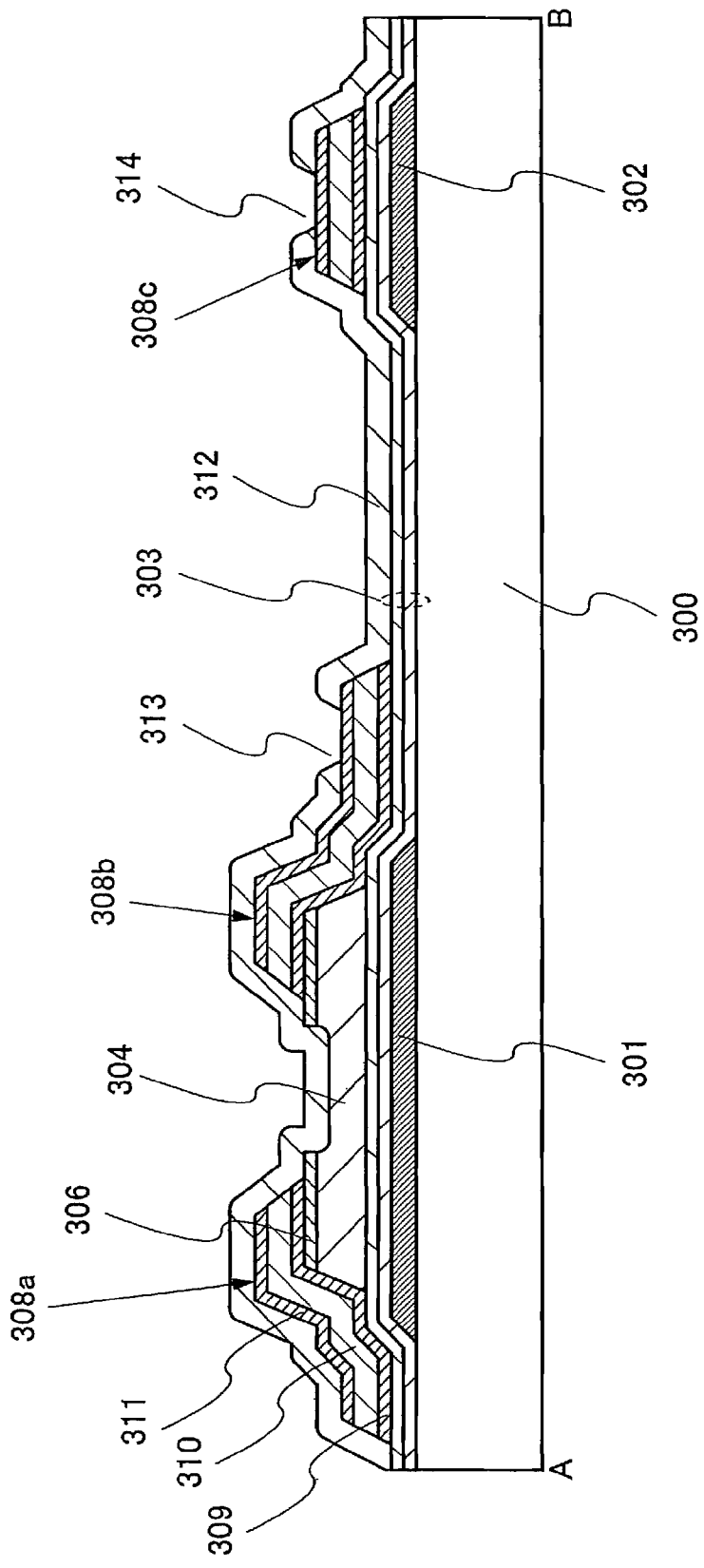
FIG. 15 is a cross-sectional view illustrating one manufacture process of a display device including a TFT in which a channel is formed using a microcrystalline semiconductor layer in Embodiment Mode 3.

A wiring layer and a protective insulating film 312 extended in a direction intersecting with the gate electrode 301 are formed (see FIG. 10 and FIG. 15). The wiring layer has a wiring 308a to which potential on a source or drain side of a TFT is supplied, a wiring 308b connected to a pixel electrode, to which potential of the other side of the TFT is supplied, and a capacitor electrode 308c.

The wiring 308a, the wiring 308b, and the capacitor electrode 308c are preferably formed using aluminum, copper, or aluminum added with an element to improve heat resistance or an element to prevent hillock (such as silicon, titanium, neodymium, or scandium). Aluminum or the like is deposited by a sputtering method or an evaporation method and processed into the predetermined pattern by photolithography. Specifically, after a conductive layer is formed over the whole surface of the element substrate 300, the predetermined resist masks are formed by photolithography and etching is conducted, so that the wiring layer is formed. Etching can be dry etching or wet etching. At this point, the impurity semiconductor layer 306 is etched utilizing the formed resist masks.

By this etching, a part of the microcrystalline silicon layer 304 may be etched. The wiring 308a and the wiring 308b are in contact with the impurity semiconductor layer 306 but separated from each other over the microcrystalline silicon layer 304. The impurity semiconductor layer 306 positioned between the wiring 308a and the wiring 308b is removed by etching, so that a channel formation region of the TFT is formed.

Alternatively, the wiring 308a, the wiring 308b, and the capacitor electrode 308c may be formed of a conductive nanopaste such as silver or copper by a screen printing method, an inkjet method, or a nanoimprint method.

The wiring 308a, the wiring 308b, and the capacitor electrode 308c may be formed of the above-described aluminum, copper, or the like or may have a staked structure including a conductive material which functions as a barrier layer for improving adhesion with a base and preventing diffusion of impurities. For example, a first conductive film 309 functioning as a bather layer is formed of refractory metal such as molybdenum, chromium, titanium, tantalum, or titanium nitride, a second conductive film 310 is formed of the above-described aluminum or the like, the third conductive film 311 is formed of the similar refractory metal to the first conductive film 309 (see FIG. 15).

The protective insulating film 312 is formed to cover the microcrystalline silicon layer 304, the wiring 308a, the wiring 308b, the capacitor electrode 308c, and the like. The protective insulating film 312 is preferably formed of silicon nitride or silicon nitride oxide. In the protective insulating film 312, a contact hole 313 for exposing the wiring 308b and a contact hole 314 for exposing the capacitor electrode 308c are formed.

(5) Formation of Pixel Electrode

Figure 11:
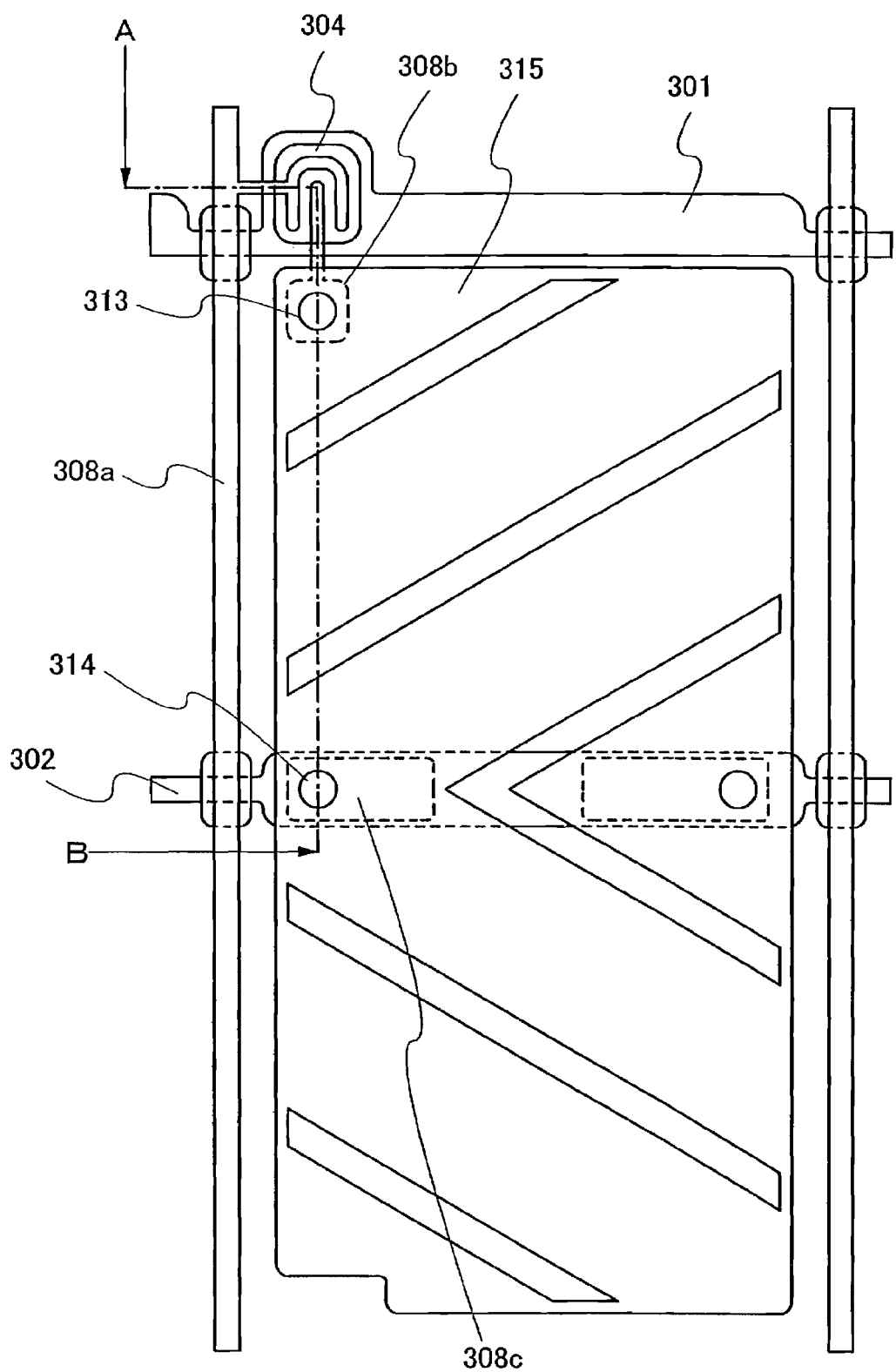
FIG. 11 is a plane view illustrating one manufacture process of a display device including a TFT in which a channel is formed using a microcrystalline semiconductor layer in Embodiment Mode 3.
Figure 12:
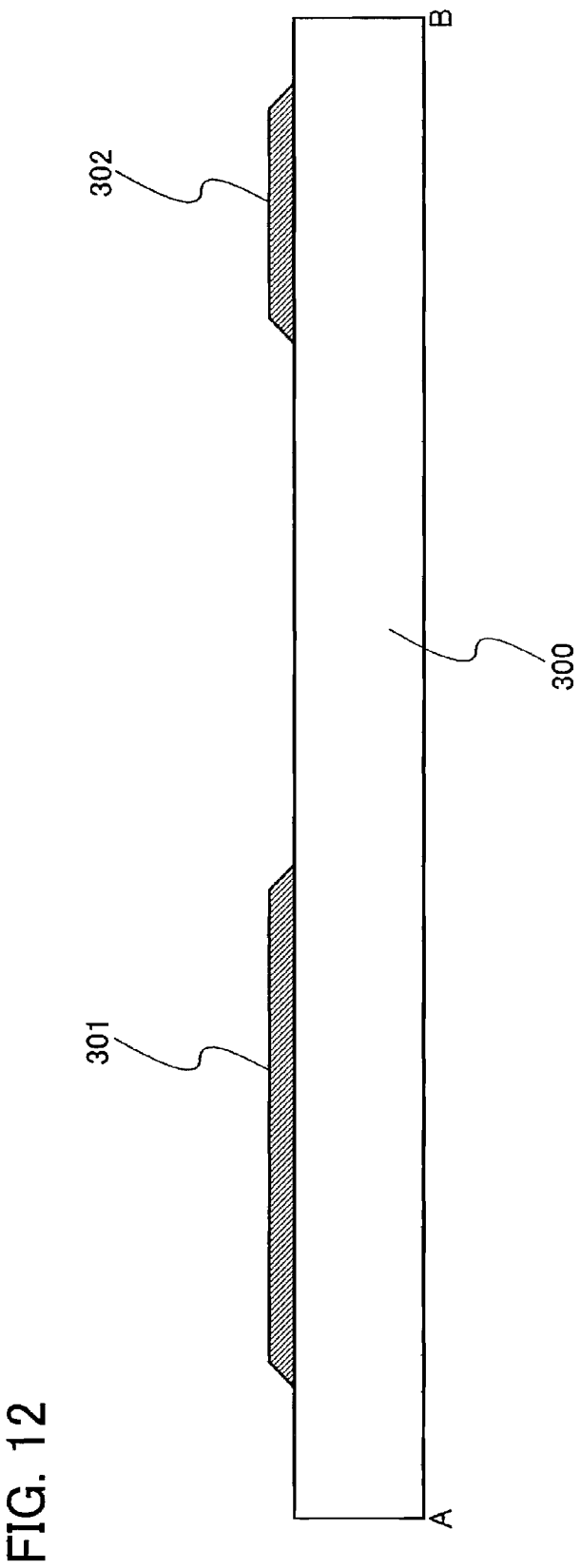
FIG. 12 is a cross-sectional view illustrating one manufacture process of a display device including a TFT in which a channel is formed using a microcrystalline semiconductor layer in Embodiment Mode 3.
Figure 16:
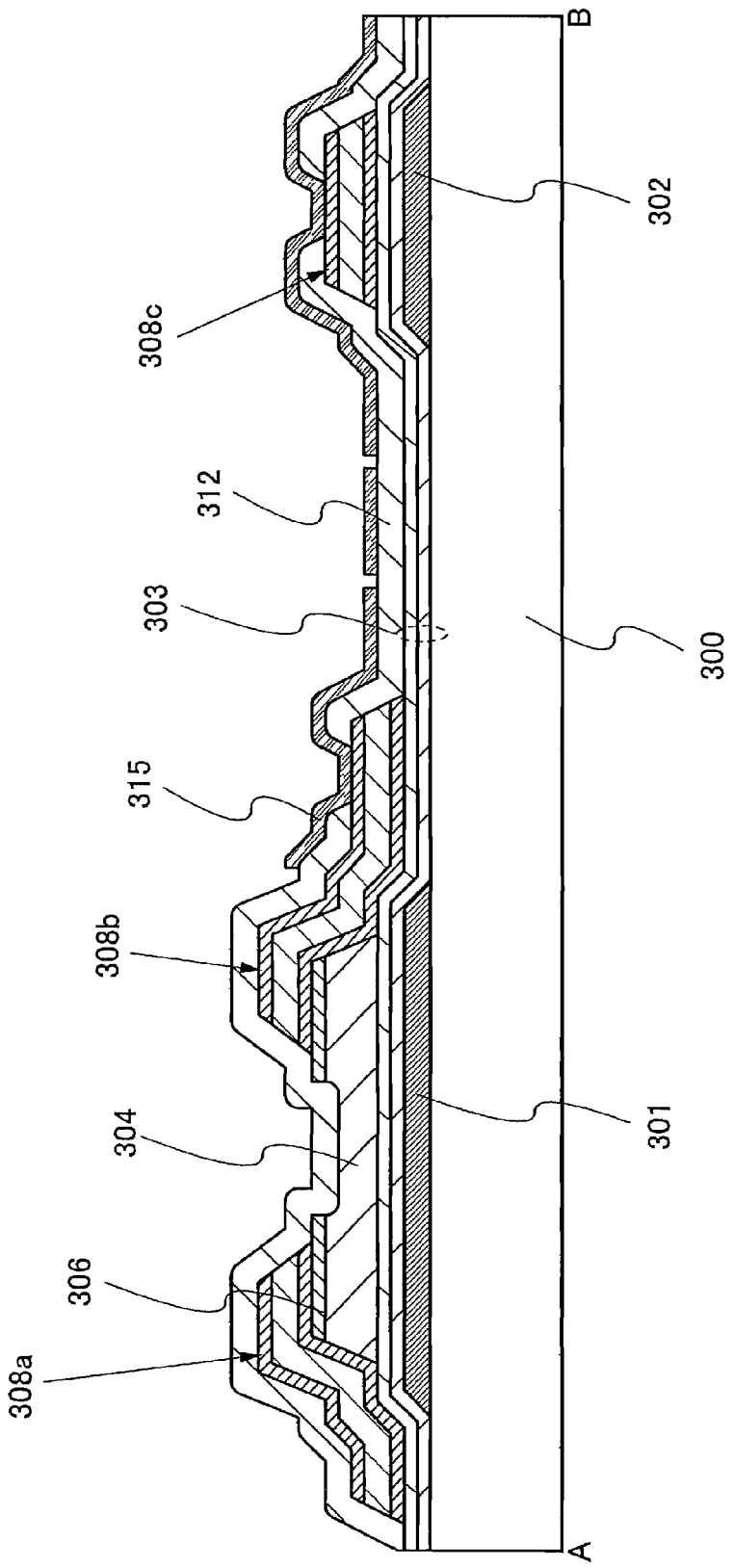
FIG. 16 is a cross-sectional view illustrating one manufacture process of a display device including a TFT in which a channel is formed using a microcrystalline semiconductor layer in Embodiment Mode 3.

A pixel electrode 315 is formed over the protective insulating film 312 (see FIG. 11 and FIG. 16). The pixel electrode 315 is connected to the wiring 308b in the contact hole 313 and connected to the capacitor electrode 308c in the contact hole 314. The pixel electrode 315 is formed of an electrode material having a light-transmitting property, such as indium tin oxide, zinc oxide, or tin oxide, or an organic conductive material.

Slits are provided in the pixel electrode 315, whereby alignment of liquid crystal can be controlled. Such a structure is employed for VA (Vertical Alignment) type liquid crystal. The VA-type liquid crystal is a kind of methods for controlling alignment of liquid crystal molecules of a liquid crystal panel. The VA-type liquid crystal is a method in which liquid crystal molecules are aligned in a vertical direction to a panel surface when no voltage is applied. A counter substrate is attached to the element substrate, and a liquid crystal layer is provided therebetween, so that a liquid crystal display device can be completed. Note that the pixel electrode 315 can have any structures, and the structure can be changed as appropriate for the purpose of use.

Although this embodiment mode exemplifies a structure of a pixel of a liquid crystal panel, this embodiment mode can be applied to an electroluminescent display panel in accordance with the similar steps.

In such a manner, the TFT, the pixel electrode 315 connected to the TFT, and a storage capacitor portion are formed over the element substrate 300. According to this embodiment mode, a channel of the TFT is formed using microcrystalline silicon, whereby change in the threshold voltage of the can be suppressed, and operation stability of the display device can be secured. The microcrystalline silicon layer can be formed by a plasma CVD method, and a process of laser crystallization is not needed, which is different from the case of forming polysilicon; therefore, productivity is not impaired.

Embodiment Mode 4

Figure 17:
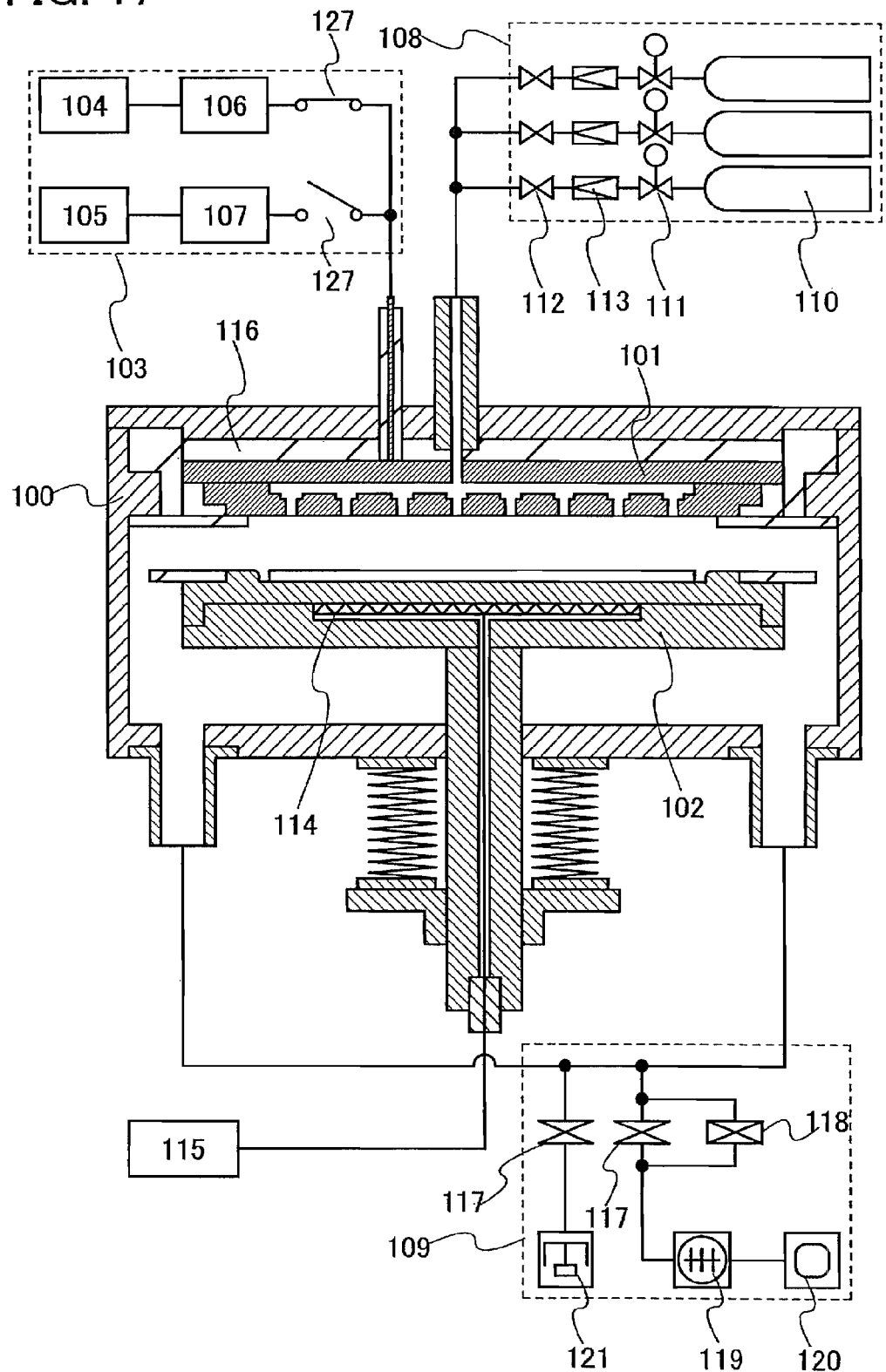
FIG. 17 is a diagram illustrating a structure of a reaction chamber in which a plurality of high-frequency electric powers are applied to one electrode.

FIG. 17 illustrates an example of a structure of a plasma CVD apparatus to which high-frequency electric powers with different frequencies are applied. Description of the same parts as those of the plasma CVD apparatus shown in FIG. 1 is omitted.

A first electrode 101 and a second electrode 102 are provided in a reaction chamber 100 which is similar to that of FIG. 1. Similarly to FIG. 1, a high-frequency power supply means 103 is connected to the first electrode 101. The ground potential is supplied to the second electrode 102 which has such a shape that a substrate can be mounted. The other parts of the structure are similar to those of FIG. 1.

Switches 127 are provided between first and second matching boxes 106 and 107 included in the high-frequency power supply means 103 and the first electrode 101. The switches 127 switch connections between first and second high-frequency power sources 104 and 105 and the first electrode 101. In other words, by operation of the switches 127, the following states can be selected. One of the states is that output from both the first high-frequency power source 104 and the second high-frequency power source 105 is supplied to the first electrode 101. The other state is that output from either the first high-frequency power source 104 or the second high-frequency power source 105 is supplied to the first electrode 101. With use of the switches 127, glow discharge plasma with different plasma density can be produced in the same reaction chamber.

Similarly to FIG. 1, an alternating-current power supplied from the first high-frequency power source 104 is a high-frequency electric power with a wavelength of about 10 m or more, which is a frequency in the HF band of 3 MHz to 30 MHz inclusive, typically 13.56 MHz. Similarly to FIG. 1, an alternating-current power supplied from the second high-frequency power source 105 is a high frequency electric power with a wavelength of about less than 10 m, which is a frequency in the VHF band of higher than 30 MHz and 300 MHz or lower. Thus, the high-frequency electric power in the HF band which does not cause the surface standing wave is supplied to the first electrode 101 so that glow discharge plasma is produced, and the high-frequency electric power belonging to the VHF band is supplied so that density of the glow discharge plasma is increased. As a result, a thin film with high film quality and homogeneity can be formed over a large-sized substrate whose a long side exceeds 2000 mm.

In a case where different kinds of thin films such as a microcrystalline semiconductor layer and an amorphous layer are successively formed, supply of the high-frequency electric power from the second high-frequency power source 105 is blocked by the switch 127, and the film formation may be continued with only the high-frequency electric power supplied from the first high-frequency power source 104. By operation of the switch 127, thin films with high uniformity can be formed efficiently.

Similarly to FIG. 1, the first electrode 101 is also connected to a gas supply means 108. In the reaction chamber 100, the first electrode 101 has a surface which faces the substrate and which is processed into a shower-plate shape to have a plurality of holes.

Figure 18:
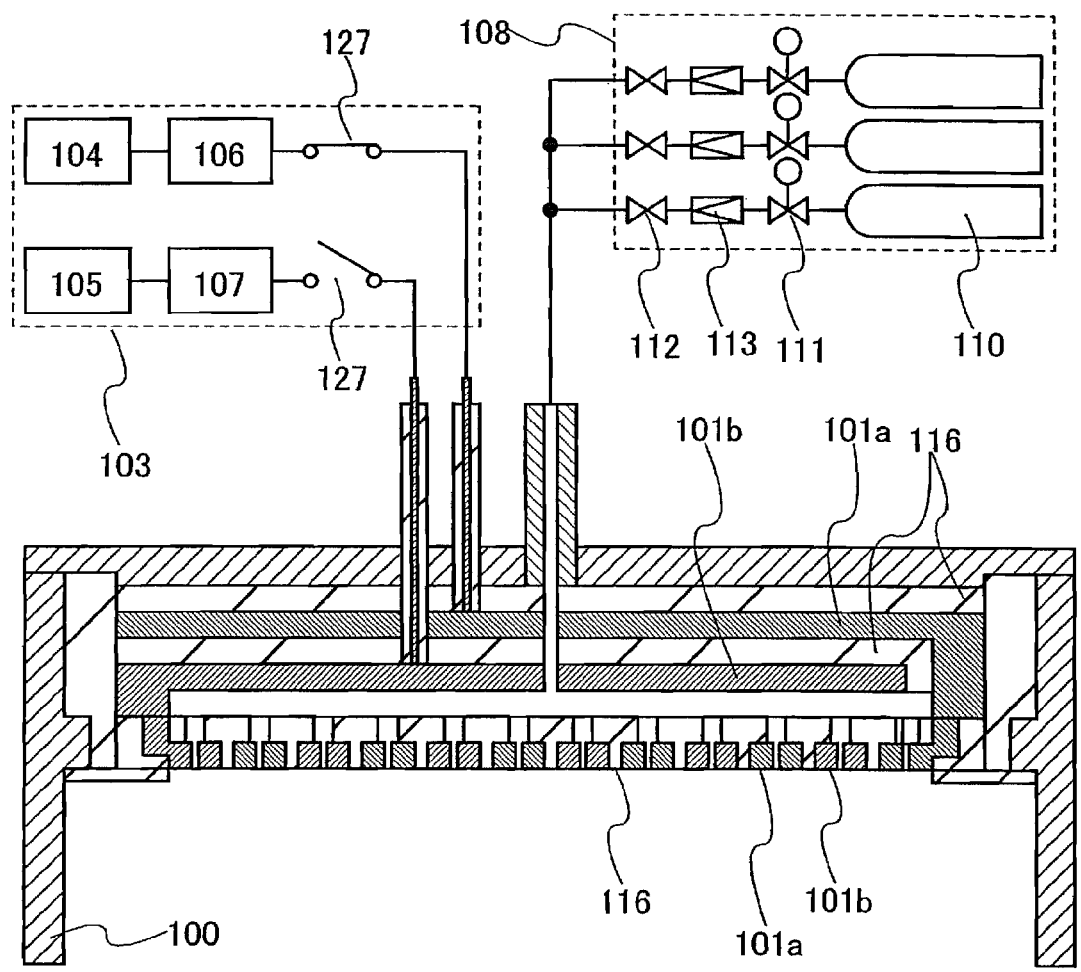
FIG. 18 is a diagram illustrating another example of an electrode structure in a reaction chamber in which a plurality of high-frequency electric powers are applied to one electrode.

FIG. 18 illustrates another structure of the first electrode 101. The first electrode 101 is constituted by a first electrode 101a to which a high-frequency electric power from the first high-frequency power source 104 is supplied and a first electrode 101b to which a high-frequency electric power from the second high-frequency power source 105 is supplied. The first electrode 101a is disposed over the first electrode 101b with an insulating material 116 interposed therebetween. Small holes are provided on surfaces of the first electrode 101a and the first electrode 101b which face the substrate, and the first electrode 101a and the first electrode 101b are disposed in a comb-like form so as to engage with each other. In addition, the adjacent portions of the electrodes, which are disposed in a comb-like form, in the longitudinal direction are separated with the insulating material 116 so as not to be contacted. The first electrode 101 shown in FIG. 17 can be replaced by the structure shown in FIG. 18, and the similar effect can be obtained.

Similarly to FIG. 1, an evacuation means 109 connected to the reaction chamber 100 has functions of vacuum evacuation and controlling the reaction chamber to be kept at the predetermined pressure in a case of supplying a reaction gas. The structure of the evacuation means 109 is similar to that of FIG. 1.

Similarly to FIG. 1, a substrate heater 114, a temperature of which is controlled by a heater controller 115, is provided for the second electrode 102.

With the reaction chamber of the plasma CVD apparatus of this embodiment mode, a wide variety of thin films can be formed, such as an insulating layer typified by a silicon oxide layer or a silicon nitride layer; a semiconductor layer typified by a microcrystalline silicon layer or an amorphous silicon layer; and other thin films used in TFTs and photoelectric conversion devices. In particular, the reaction chamber is effective in the case of forming a thin film over a large-sized substrate whose a long side exceeds 2000 m. Hereinafter, a method for forming a thin film will be described in time series with reference to FIG. 19.

Figure 19:
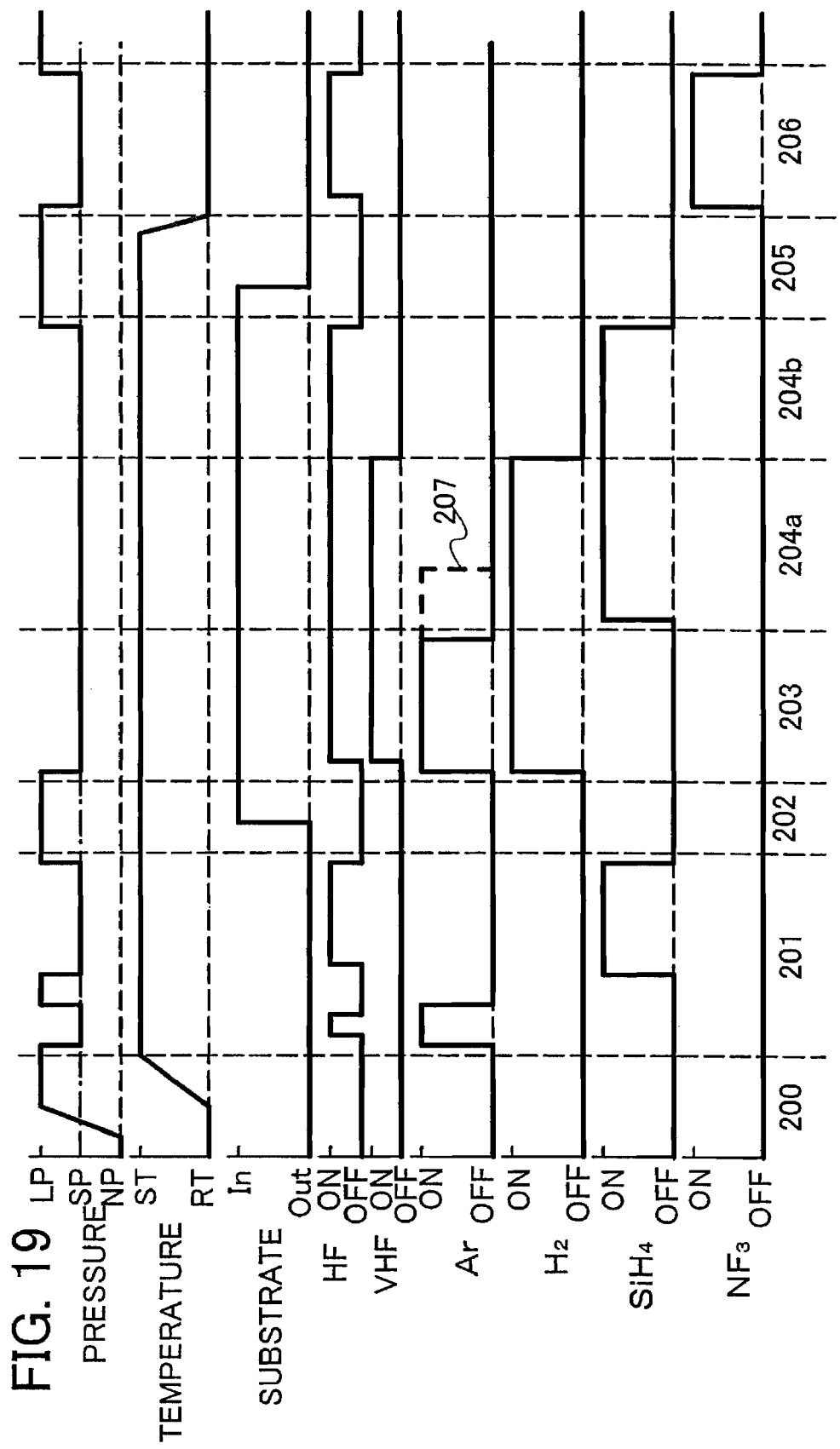
FIG. 19 is an example of a timing chart illustrating steps of forming a microcrystalline silicon layer.

FIG. 19 is a typical example of a timing chart for describing steps in which a microcrystalline silicon layer and an amorphous silicon layer are successively formed. Description of the timing chart of FIG. 19 begins with a step 200 of vacuum evacuation of the reaction chamber from the atmospheric pressure to vacuum, which is followed by a precoating step 201, a substrate carrying-in step 202, a base pretreatment step 203, a first film formation step 204a, a second film formation step 204b, a substrate carrying-out step 205, and a cleaning step 206. The steps are described in time series. Description that is similar to that of the timing chart shown in FIG. 5 is omitted.

First, the reaction chamber is evacuated to the predetermined degree of vacuum similarly to FIG. 5, and then the precoating step 201 begins. In the precoating step 201, after silane is supplied, a first high-frequency electric power in the HF band is applied to produce glow discharge plasma. By the glow discharge plasma produced by supply of the high-frequency electric power in the BF band, a silicon layer can be deposited in the reaction chamber without any influence of effect of the plasma standing wave.

After the precoating step 201, the substrate carrying-in step 202 is performed similarly to FIG. 5 and followed by the base pretreatment step 203. The base pretreatment step 203 is preferably performed because it is particularly effective in the case of forming the microcrystalline silicon layer similarly to FIG. 5. In order to promote generation of microcrystalline nuclei, it is effective to supply a rare gas such as argon continuously until the initial step of formation of the microcrystalline silicon layer as shown by a dashed line 207 in FIG. 19.

The base pretreatment step 203 is followed by the first film formation step 204a for forming the microcrystalline silicon layer. The microcrystalline silicon layer is formed by glow discharge plasma produced with supply of the reaction gas similarly to FIG. 5.

The glow discharge plasma is produced, as described in this embodiment mode, by applying the first high-frequency electric power in the HF band of 3 MHz to 30 MHz inclusive, typically, 1356 MHz, and the second high-frequency electric power in the VHF band of higher than 30 MHz and 300 MHz or lower which are superimposed on each other. The glow discharge plasma is produced by supplying the first high-frequency electric power that does not cause the surface standing wave, and density of plasma is increased by supplying the second high-frequency electric power belonging to the VHF band, whereby a thin film with homogeneity and high film quality can be formed over the large-sized substrate whose a long side exceeds 2000 mm.

Hydrogen radical works on a surface where microcrystalline silicon is grown, whereby a large amount of amorphous components precipitated in the initial step of growing the microcrystalline silicon layer is etched, so that the percentage of microcrystal can be increased. In addition, hydrogen excited by the high-frequency electric power in the VHF band or excited species of a rare gas works on the surface where the microcrystalline silicon is grown, whereby crystallization is promoted.

Similarly to FIG. 5, the precoating step 201 can prevent the microcrystalline silicon layer from taking in metal included in the reaction chamber as an impurity.

Similarly to FIG. 5, in the first film formation step 204a, helium may be added to the reaction gas.

Figure 20:
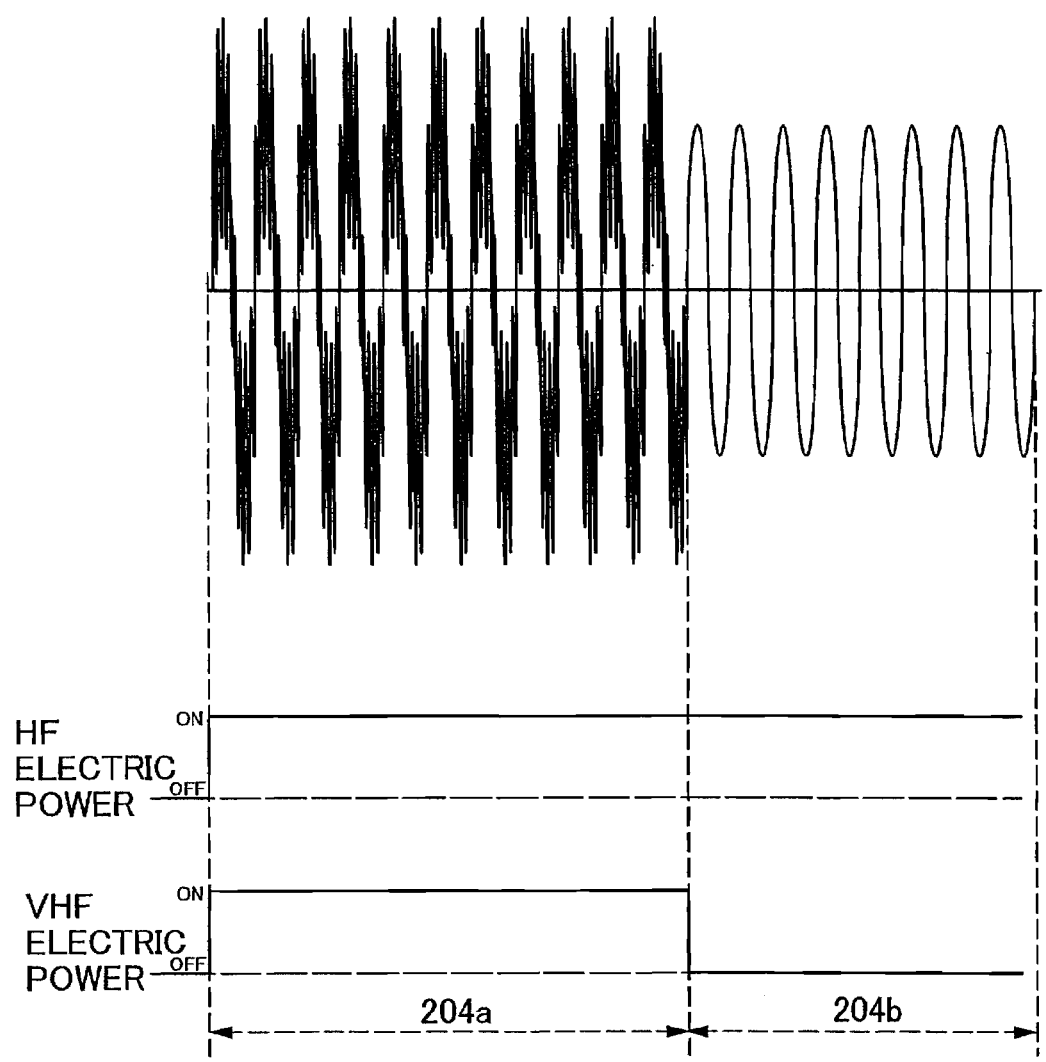
FIG. 20 is a schematic view showing an example of a waveform in a case where a high-frequency electric power from a first high-frequency power source and a high-frequency electric power from a second high-frequency power source are superimposed.

After the formation of microcrystalline silicon is finished, the second film formation step 204b is performed. In the second film formation step 204b, the flow ratio of silane and hydrogen is changed (the dilution ratio of hydrogen with respect to silane is lowered) or supply of hydrogen is stopped, so that the amorphous silicon layer is formed. With such a step, supply of the second high-frequency electric power in the VHF band is stopped as shown in FIG. 20, and supply of the first high-frequency electric power in the HF band is continued. With such treatment, the microcrystalline silicon layer and the amorphous silicon layer can be successively formed.

After the second film formation step 204b is finished, supply of the reaction gas such as silane and hydrogen and supply of the high-frequency electric power are stopped. The substrate carrying-out step 205 similar to FIG. 5 is performed and followed by the cleaning step 206.

Although this embodiment mode describes the method for forming the microcrystalline silicon layer and the amorphous silicon layer with reference to FIG. 19, this embodiment mode is not limited thereto, and a variety of thin films can be formed by changing the reaction gas. The formation of the semiconductor layer in this embodiment mode can be replaced by formation of amorphous silicon, amorphous silicon germanium, amorphous silicon carbide, microcrystalline silicon germanium, microcrystalline silicon carbide, or the like. The formation of the insulating layer in this embodiment mode can be replaced by formation of silicon oxide, silicon nitride, silicon oxynitride, silicon nitride oxide, or the like.

According to this embodiment mode, a thin film with high uniformity can be formed over a large-sized substrate.

Embodiment Mode 5

This embodiment mode will exemplify an example of a structure of a plasma CVD apparatus suitable for formation of a gate insulating layer and a semiconductor layer included in a TFT, as an example of a plasma CVD apparatus to which the reaction chamber shown in Embodiment Mode 1 is applied. Description of the same parts with the plasma CVD apparatus shown in FIG. 6 is omitted.

Figure 21:
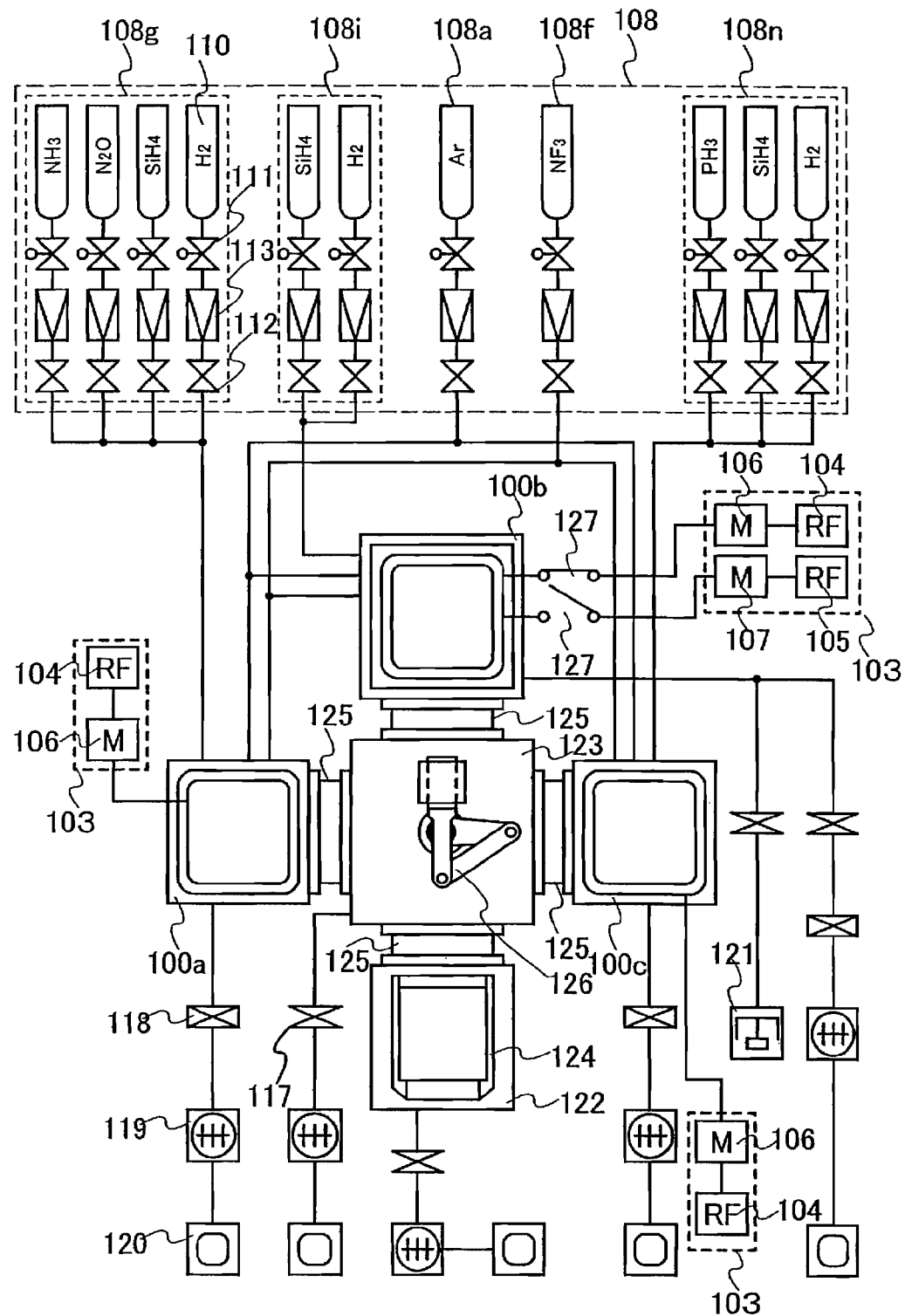
FIG. 21 is a diagram illustrating a structure of a multi-chamber plasma CVD apparatus provided with a plurality of reaction chambers.

FIG. 21 illustrates a multi-chamber plasma CVD apparatus provided with a plurality of reaction chambers, which is provided with a common chamber 123, a load/unload chamber 122, a first reaction chamber 100a, a second reaction chamber 100b, and a third reaction chamber 100c, which are similar to those of FIG. 6. Each reaction chamber is used for a different purpose depending on the kinds of thin films to be formed.

Turbo molecular pumps 119 and dry pumps 120 as evacuation means are connected to each of the reaction chambers similar to those of FIG. 6, and a cryopump 121 is connected to the second reaction chamber 100b where a microcrystalline semiconductor layer is formed. The cryopump 121 evacuates the second reaction chamber 100b to ultrahigh vacuum.

The gas supply means 108 includes cylinders 110, stop valves 112, mass flow controllers 113, and the like, similarly to FIG. 6. The cylinders 110 are filled with a gas used for process, such as a semiconductor material gas typified by silane or a rare gas. A gas supply means 108i is connected to the second reaction chamber 100b to supply a gas for forming a microcrystalline semiconductor layer or an amorphous semiconductor layer.

Similarly to FIG. 6, high-frequency power supply means 103 are connected to the reaction chambers in order to produce glow discharge plasma. As shown in this embodiment mode, switches 127 as described in this embodiment mode are provided, whereby glow discharge plasma with different plasma density can be produced in the same reaction chamber.

As described in this embodiment mode, the plurality of reaction chambers shown in FIG. 21 are used and connected with the common chamber, whereby a plurality of different layers can be stacked successively without being exposed to air. Hereinafter, a process of manufacturing a TFT with use of such a plasma CVD apparatus will be described.

Embodiment Mode 6

This embodiment mode will exemplify an example of a method for manufacturing a TFT in which a channel formation region is formed using a microcrystalline silicon layer with use of the plasma CVD apparatus described in Embodiment Mode 4 and Embodiment Mode 5, as a mode of a TFT provided in a pixel of a display device.

FIG. 22, FIG. 23, FIG. 24, and FIG. 25 are plane views of a pixel, and FIG. 26, FIG. 27, FIG. 28, FIG. 29, and FIG. 30 are cross-sectional views taken along a line A-B of the plane views. Hereinafter, description is made with reference to these plane views and cross-sectional views as appropriate. Description of the similar parts with the method for manufacturing a TFT shown in FIGS. 8 to 16 is omitted.

(1) Formation of Gate Electrode and Capacitor Electrode

Figure 22:
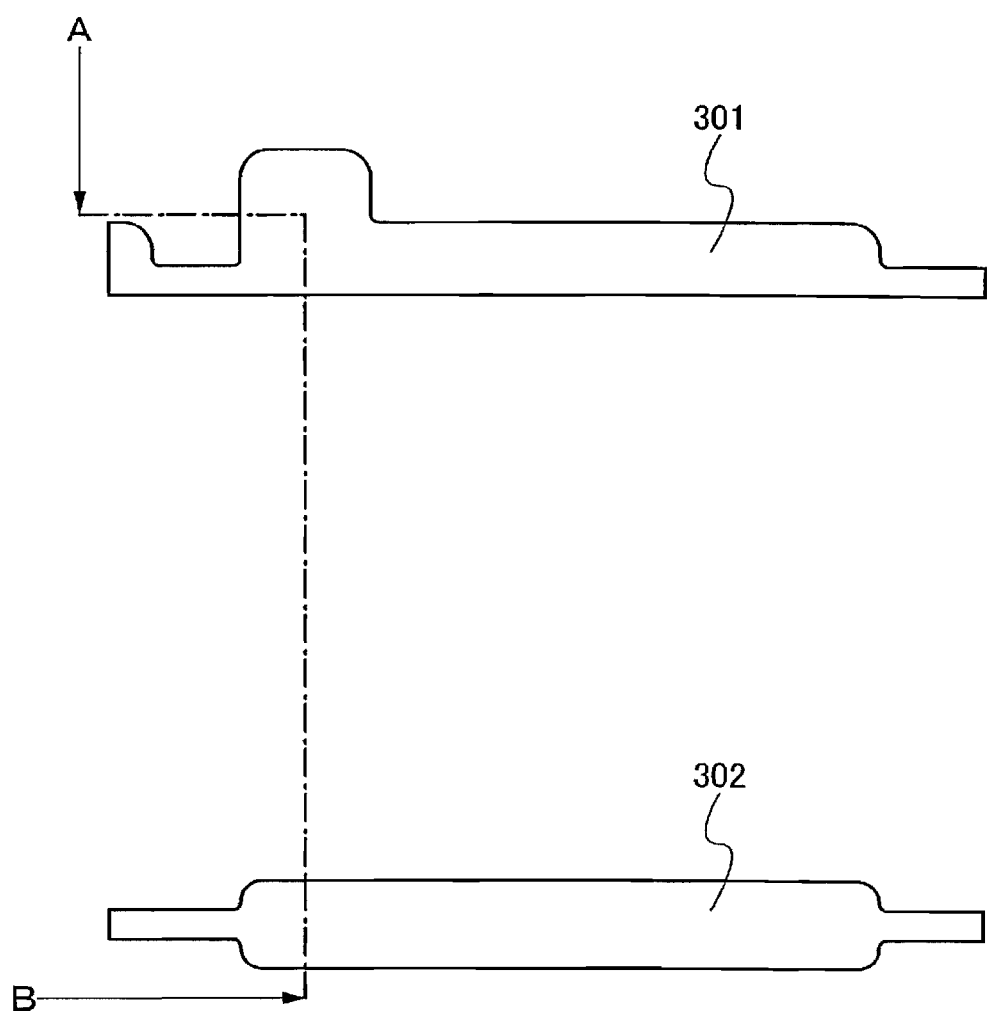
FIG. 22 is a plane view illustrating one manufacture process of a display device including a TFT in which a channel is formed using a microcrystalline semiconductor layer in Embodiment Mode 3.
Figure 26:
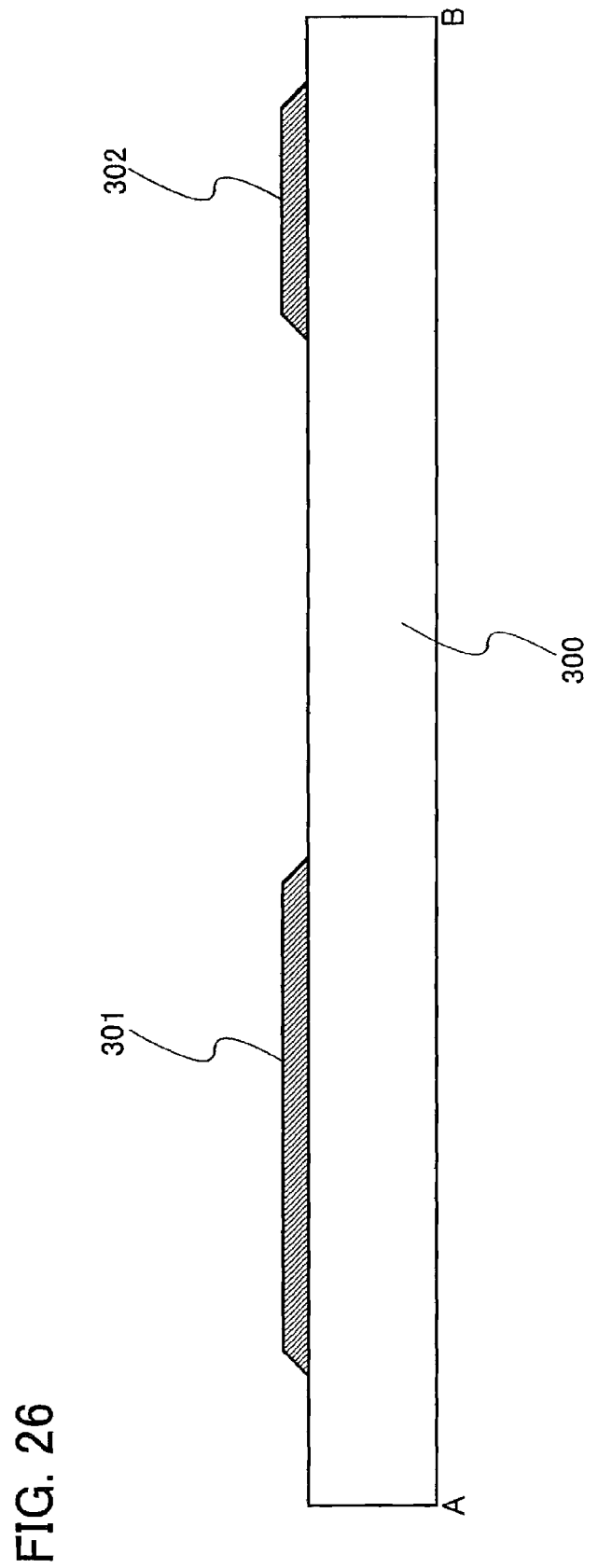
FIG. 26 is a cross-sectional view illustrating one manufacture process of a display device including a TFT in which a channel is formed using a microcrystalline semiconductor layer in Embodiment Mode 3.

A gate electrode 301 and a capacitor electrode 302 are formed over an element substrate (see FIG. 22 and FIG. 26).

Figure 27:
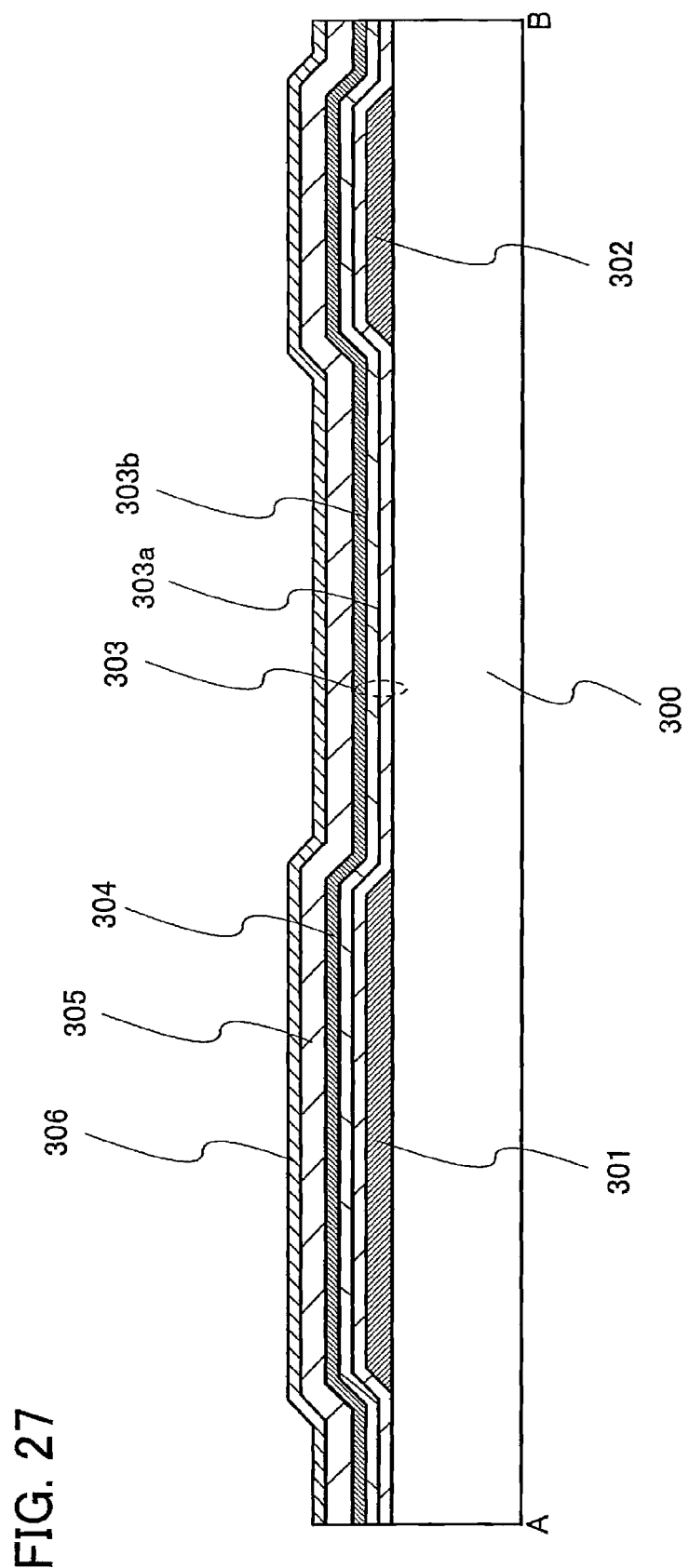
FIG. 27 is a cross-sectional view illustrating one manufacture process of a display device including a TFT in which a channel is formed using a microcrystalline semiconductor layer in Embodiment Mode 3.

(2) Formation of Gate Insulating Layer, Microcrystalline Silicon Layer, Amorphous Silicon Layer, and Impurity Semiconductor Layer After the gate electrode 301 and the capacitor electrode 302 are formed, a gate insulating layer 303, a microcrystalline silicon layer 304, an amorphous silicon layer 305, and an impurity semiconductor layer 306 are formed over the element substrate 300 (see FIG. 27). Thin films of these layers can be stacked successively without each interface of layers being exposed to air, with use of the plasma CVD apparatus described in Embodiment Mode 4 and Embodiment Mode 5.

The gate insulating layer 303 is formed by glow discharge plasma which is produced by applying high-frequency electric powers in the HF band (3 MHz to 30 MHz inclusive, typically, 13.56 MHz) and in the VHF band (higher than 30 MHz and 300 MHz or lower) which are superimposed on each other. Application of the high-frequency electric powers in different frequency bands can increase plasma density and in-plane uniformity with respect to the element substrate 300.

In the preferable formation of the microcrystalline silicon layer 304, the base pretreatment step 203 is performed, and then the first film formation step 204a for forming microcrystalline silicon is performed as described with reference to FIG. 19.

The microcrystalline silicon layer 304 is formed utilizing a mixed gas of a silicon hydride gas such as silane and hydrogen and/or a rare gas and glow discharge plasma which is produced by applying high-frequency electric powers in the HF band (3 MHz to 30 MHz inclusive, typically, 13.56 MHz) and in the VHF band (higher than 30 MHz and about 300 MHz or lower) which are superimposed on each other.

After the formation of microcrystalline silicon is finished, the second film formation step 204b is performed as described with reference to FIG. 19. In the second film formation step 204b, the flow ratio of silane and hydrogen is changed (the dilution ratio of hydrogen with respect to silane is lowered), or supply of hydrogen is stopped, so that the amorphous silicon layer 305 is formed. The amorphous silicon layer 305 is formed with a thickness of 150 nm to 400 nm. In this case, supply of the second high-frequency electric power in the VHF band is stopped, and supply of the first high-frequency electric power in the HF band is continued as shown in FIG. 20. By such treatment, the microcrystalline silicon layer 304 and the amorphous silicon layer 305 can be successively formed.

An impurity imparting one conductivity type for the purpose of valence electron control is added to the impurity semiconductor layer 306. In the preferable formation of the impurity semiconductor layer 306, the base pretreatment step 203 is performed, and then the first film formation step 204a or the second film formation step 204b is performed as described in Embodiment Mode 4 with reference to FIG. 19.

(3) Processing of Semiconductor Layer

Figure 23:
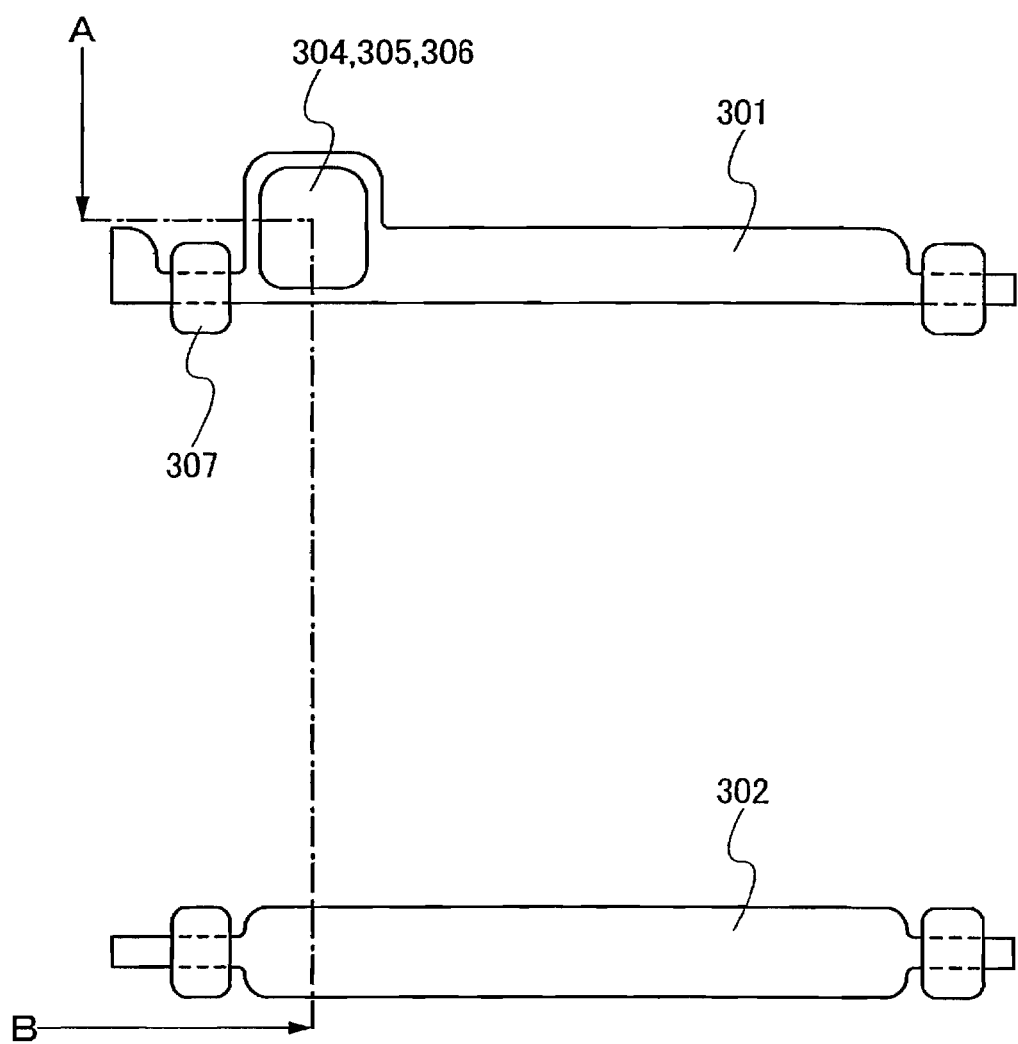
FIG. 23 is a plane view illustrating one manufacture process of a display device including a TFT in which a channel is formed using a microcrystalline semiconductor layer in Embodiment Mode 3.
Figure 28:
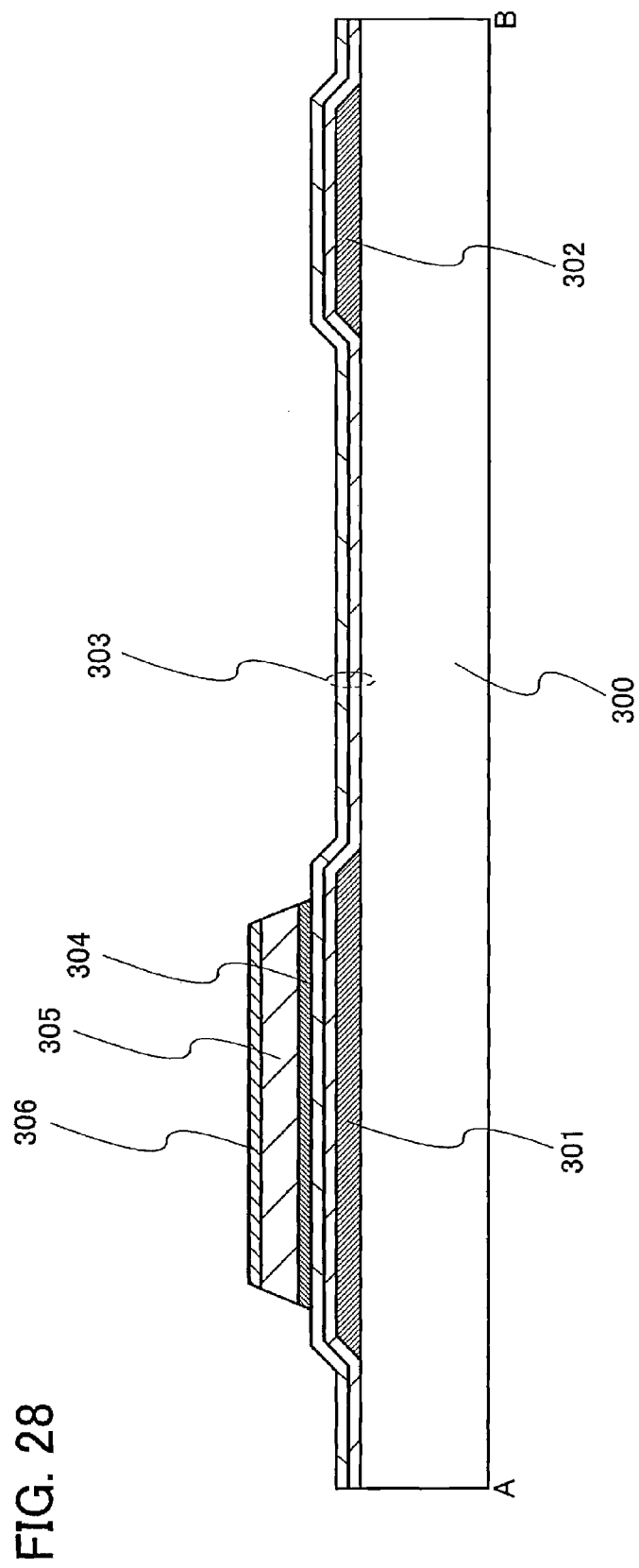
FIG. 28 is a cross-sectional view illustrating one manufacture process of a display device including a TFT in which a channel is formed using a microcrystalline semiconductor layer in Embodiment Mode 3.

The microcrystalline silicon layer 304, the amorphous silicon layer 305, and the impurity semiconductor layer 306 formed over almost the whole surface of the element substrate 300 are etched and processed into the predetermined pattern (see FIG. 23 and FIG. 28).

(4) Formation of Wiring Layer and Protective Layer

Figure 24:
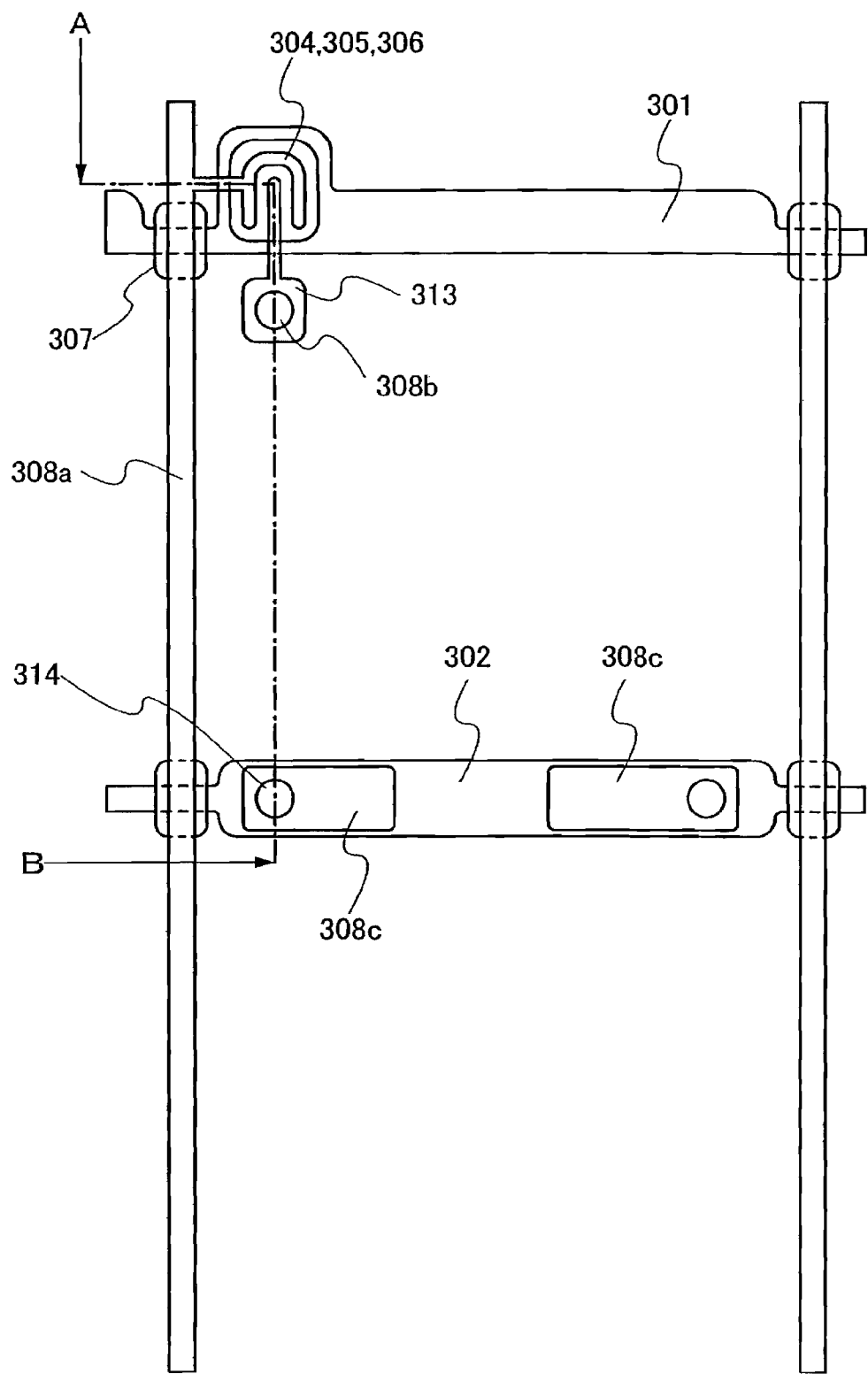
FIG. 24 is a plane view illustrating one manufacture process of a display device including a TFT in which a channel is formed using a microcrystalline semiconductor layer in Embodiment Mode 3.
Figure 29:
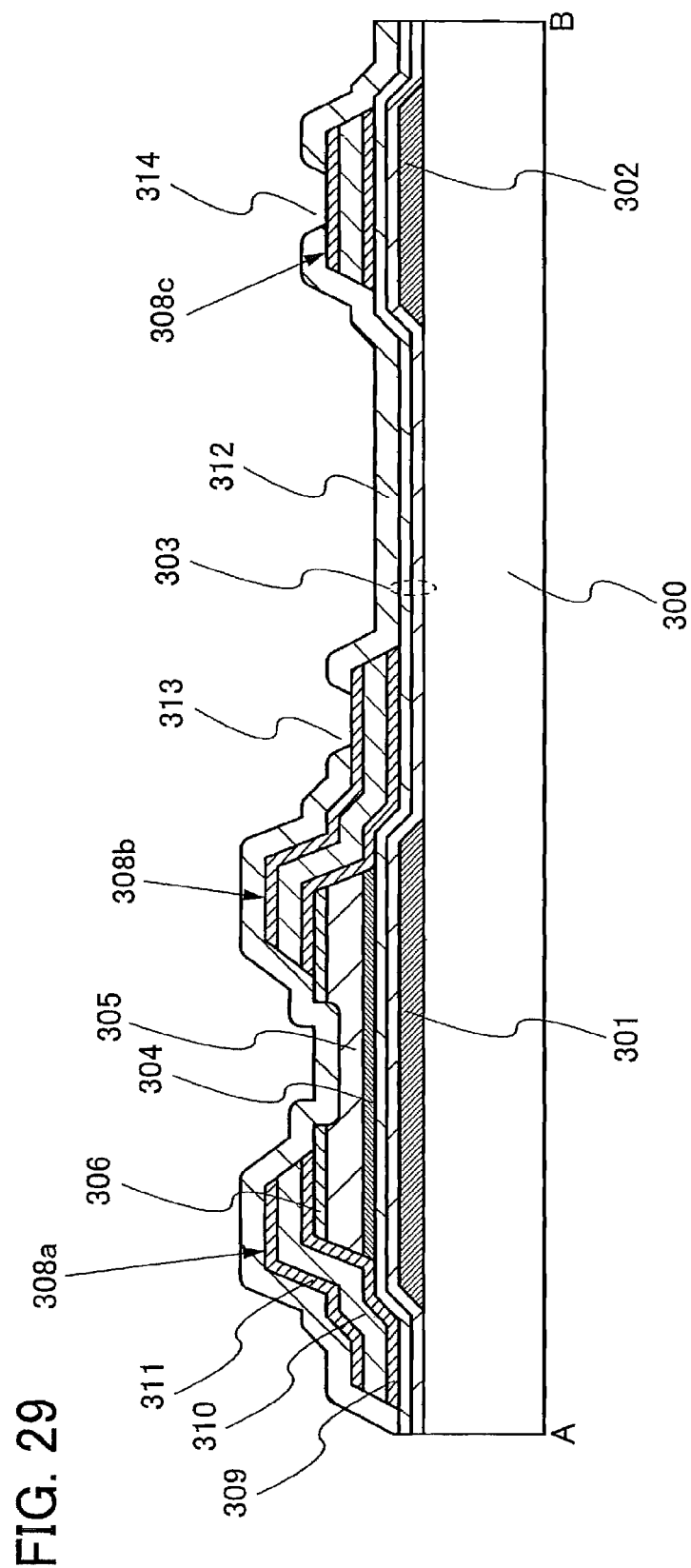
FIG. 29 is a cross-sectional view illustrating one manufacture process of a display device including a TFT in which a channel is formed using a microcrystalline semiconductor layer in Embodiment Mode 3.

A wiring layer and a protective insulating film 312 extending in a direction intersecting with the gate electrode 301 are formed (see FIG. 24 and FIG. 29). The wiring layer has a wiring 308a to which potential on a source or drain side of a TFT is supplied, a wiring 308b connected to a pixel electrode, to which potential of the other side is supplied, and a capacitor electrode 308c.

The wiring 308a, the wiring 308b, and the capacitor electrode 308c may have a stacked structure which includes a conductive material which functions as a barrier layer for improving adhesion with a base and preventing diffusion of impurities. For example, a first conductive film 309 functioning a barrier layer is formed of refractory metal such as molybdenum, chromium, titanium, tantalum, or titanium nitride; a second conductive film 310 is formed of aluminum or the like; and a third conductive film 311 is formed of the conductive material similar to that of the first conductive film 309 (see FIG. 29).

The conductive layer is formed over the whole surface of the element substrate 300, the predetermined resist mask is formed by photolithography, and etching is conducted, so that the wiring 308a, the wiring 308b, and the capacitor electrode 308c are formed. With use of the formed resist mask at this stage, the impurity semiconductor layer 306 is etched, so that a channel formation region of the TFT is formed. The amorphous silicon layer 305 is partially etched at this region, and the film thickness of the amorphous silicon layer 305 at this region is thinner than that at a region overlapping with the impurity semiconductor layer 306. By this etching, the microcrystalline silicon layer 304 may be partially etched.

The microcrystalline silicon layer 304 is covered with the amorphous silicon layer 305 to prevent the microcrystalline silicon layer 304 from being oxidized. Thus, the microcrystalline silicon layer 304 with high quality in a deposited state can be held over the gate insulating layer 303. The microcrystalline silicon layer 304 formed over the gate insulating layer 303 becomes the channel formation region, which is formed by superimposing different high-frequency electric powers in the HF band and the VHF band on each other. Therefore, the microcrystalline silicon layer 304 contributes to enhancement of electron field-effect mobility of the TFT. The amorphous silicon layer 305 over the microcrystalline silicon layer 304 is provided between the source and drain regions of the TFT to contribute to reduction of off current.

The protective insulating film 312 is formed to cover the microcrystalline silicon layer 304, the amorphous silicon layer 305, the wiring 308a, the wiring 308b, and the capacitor electrode 308c.

(5) Formation of Pixel Electrode

Figure 25:
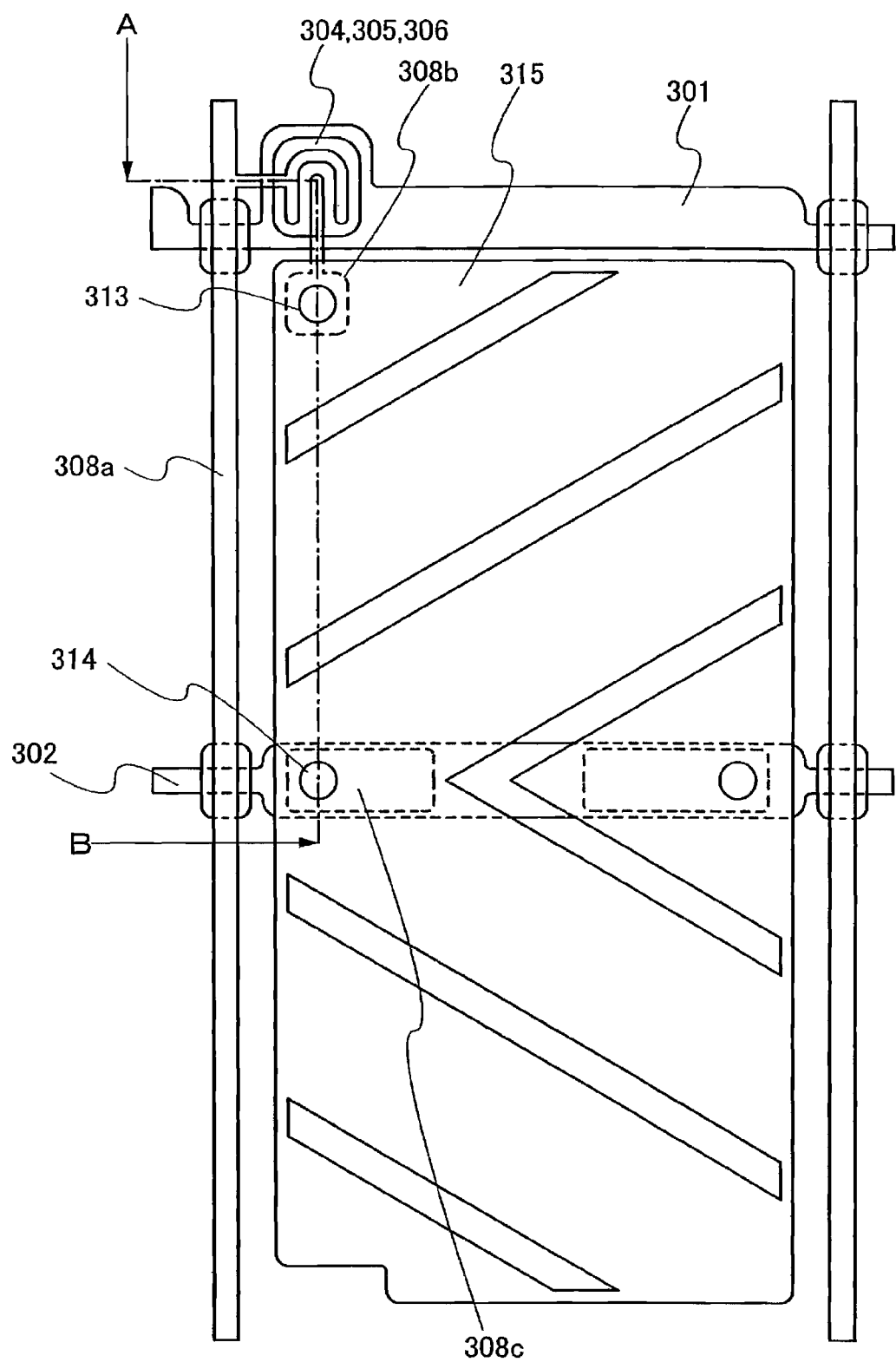
FIG. 25 is a plane view illustrating one manufacture process of a display device including a TFT in which a channel is formed using a microcrystalline semiconductor layer in Embodiment Mode 3.
Figure 30:
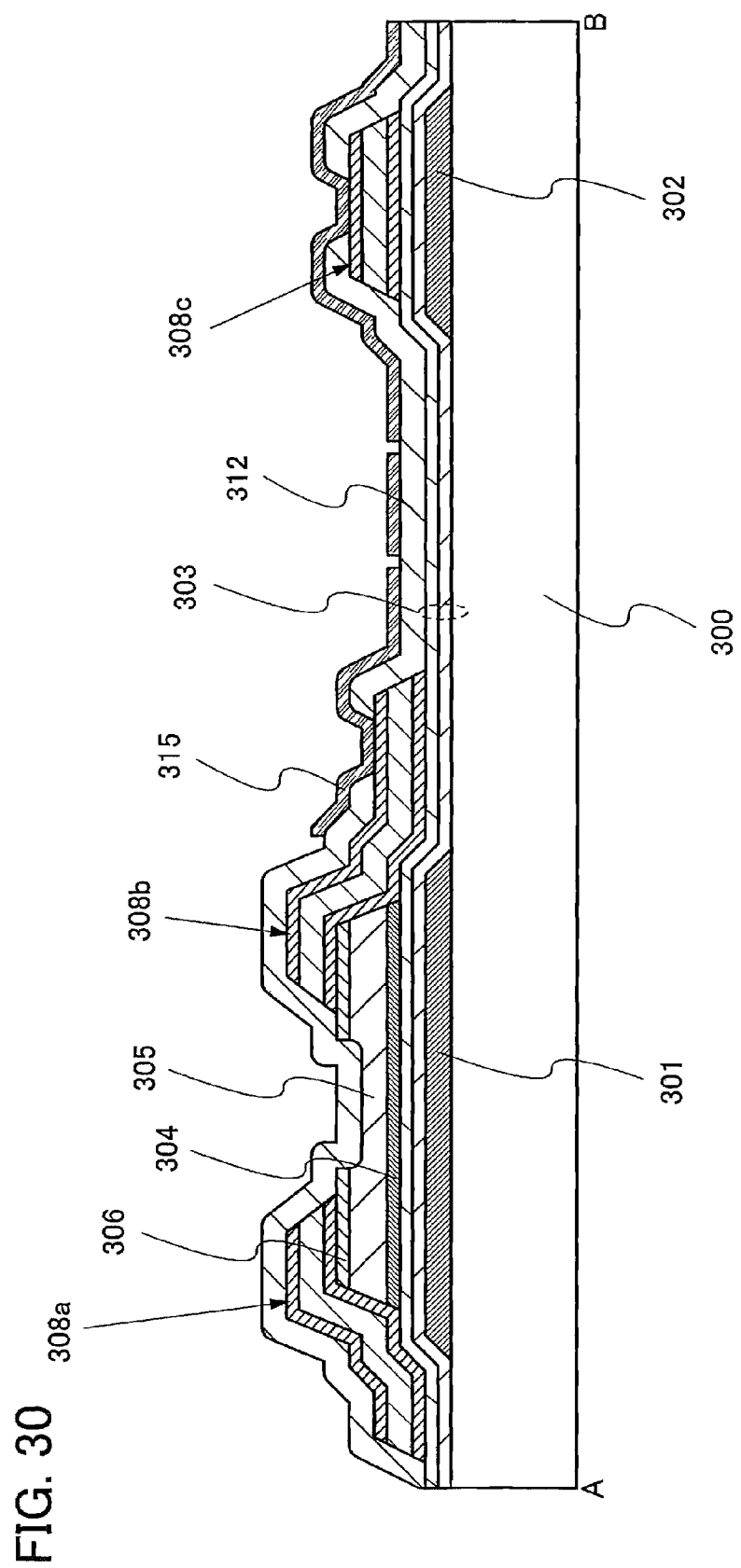
FIG. 30 is a cross-sectional view illustrating one manufacture process of a display device including a TFT in which a channel is formed using a microcrystalline semiconductor layer in Embodiment Mode 3.

A pixel electrode 315 is formed over the protective insulating film 312 (see FIG. 25 and FIG. 30).

In such a manner, the TFT, the pixel electrode 315 connected to the TFT, and the storage capacitor portion are formed over the element substrate 300. According to this embodiment mode, the channel of the TFT is formed of microcrystalline silicon, whereby change in the threshold voltage of the TFT can be suppressed, and operation stability of the display device can be secured. The microcrystalline silicon layer can be formed by a plasma CVD method, and a process of laser crystallization is not needed, which is different from the case of forming polysilicon; thus, productivity is not impaired.

This application is based on Japanese Patent Application serial no. 2007-212848 filed with Japan Patent Office on Aug. 17, 2007, the entire contents of which are hereby incorporated by reference.

What is claimed is:

1. A plasma CVD apparatus comprising:
a reaction chamber;
a first electrode and a second electrode provided in the reaction chamber;
a first high-frequency power source that applies a first alternating-current power to the first electrode, the first alternating-current power having a frequency corresponding to a wavelength of 10 m or more;
a second high-frequency power source that applies a second alternating-current power to the second electrode, the second alternating-current power having a frequency corresponding to a wavelength of less than 10 m;
a switch that selects a first state in which an output from the first high-frequency power source is applied to the first electrode and an output from the second high-frequency power source is applied to the second electrode at a same time, and a second state in which only the output from the first high-frequency power source is applied to the first electrode,
wherein glow discharge plasma is produced by applying an output from the first high-frequency power source to the first electrode and an output from the second high-frequency power source to the second electrode at a same time,
wherein the first electrode and the second electrode are adjacent to each other, are provided in the same plane and are separated from each other by an insulating material, and
wherein the first electrode and the second electrode have an almost rectangular shape including at least one side of 2000 mm or longer.

2. A plasma CVD apparatus according to claim 1, wherein the second high-frequency power source oscillates a pulse.

3. The plasma CVD apparatus according to claim 1, further comprising a common chamber connected to the reaction chamber and a load/unload chamber connected to the common chamber.

4. The plasma CVD apparatus according to claim 1, wherein the first electrode and the second electrode are formed in a comb-like form to engage with each other.

5. A plasma CVD apparatus comprising:
a reaction chamber;
a first electrode and a second electrode provided in the reaction chamber;
a first high-frequency power source that applies a high-frequency electric power of 3 MHz to 30 MHz inclusive to the first electrode;
a second high-frequency power source that applies a high-frequency electric power of higher than 30 MHz and 300 MHz or lower to the second electrode; and
a switch that selects a first state in which an output from the first high-frequency power source is applied to the first electrode and an output from the second high-frequency power source is applied to the second electrode at a same time, and a second state in which only the output from the first high-frequency power source is applied to the first electrode,
wherein glow discharge plasma is produced by applying an output from the first high-frequency power source to the first electrode and an output from the second high-frequency power source to the second electrode at a same time,
wherein the first electrode and the second electrode are adjacent to each other, are provided in the same plane and are separated from each other by an insulating material, and
wherein the first electrode and the second electrode have an almost rectangular shape including at least one side of 2000 mm or longer.

6. A plasma CVD apparatus according to claim 5, wherein the second high-frequency power source oscillates a pulse.

7. The plasma CVD apparatus according to claim 5, further comprising a common chamber connected to the reaction chamber and a load/unload chamber connected to the common chamber.

8. The plasma CVD apparatus according to claim 5, wherein the first electrode and the second electrode are formed in a comb-like form to engage with each other.

* * * * *